United States Patent
Koshihara et al.

(10) Patent No.: US 10,403,701 B2
(45) Date of Patent: Sep. 3, 2019

(54) ELECTRO-OPTICAL DEVICE AND ELECTRONIC APPARATUS

(71) Applicant: SEIKO EPSON CORPORATION, Tokyo (JP)

(72) Inventors: Takeshi Koshihara, Matsumoto (JP); Hitoshi Ota, Shiojiri (JP); Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/158,953

(22) Filed: Oct. 12, 2018

(65) Prior Publication Data
US 2019/0051714 A1 Feb. 14, 2019

Related U.S. Application Data

(63) Continuation of application No. 15/815,295, filed on Nov. 16, 2017, now Pat. No. 10,134,822, which is a
(Continued)

(30) Foreign Application Priority Data

Feb. 15, 2016 (JP) .................. 2016-025617

(51) Int. Cl.
*H01L 27/32* (2006.01)
*H01L 51/52* (2006.01)
(Continued)

(52) U.S. Cl.
CPC ........... *H01L 27/3262* (2013.01); *G09G 3/32* (2013.01); *H01L 27/326* (2013.01);
(Continued)

(58) Field of Classification Search
CPC ............. H01L 27/3262; H01L 27/3265; H01L 27/3206; H01L 27/3276; H01L 51/5265;
(Continued)

(56) References Cited

U.S. PATENT DOCUMENTS 5,990,629 A * 11/1999 Yamada ............... G09G 3/2011
257/71
8,344,374 B2 1/2013 Yamazaki et al.
(Continued)

FOREIGN PATENT DOCUMENTS

JP 2004-004708 A 1/2004
JP 2004-198493 A 7/2004
(Continued)

OTHER PUBLICATIONS

Nov. 16, 2017 Notice of Allowance issued in U.S. Appl. No. 15/422,976.
(Continued)

*Primary Examiner* — David Vu
(74) *Attorney, Agent, or Firm* — Oliff PLC

(57) ABSTRACT

Subpixels of R, G, and B corresponding to a scanning line as a first conductive layer extended in a row direction and a data transfer line as a second conductive layer extended in a column direction are provided. A plurality of transistors in the subpixel of each of the colors is disposed along the column direction, and a reflective layer in the subpixel of at least one color is disposed along the row direction so as to overlap any transistor of subpixels of each display color. A center position of a disposition region of a reflective layer in one pixel unit including the subpixels of R, G, and B is different from a center position of a disposition region of a transistor in one pixel unit.

20 Claims, 21 Drawing Sheets

Related U.S. Application Data continuation of application No. 15/422,976, filed on Feb. 2, 2017, now Pat. No. 9,847,383.

(51) Int. Cl.
  *G09G 3/32* (2016.01)
  *H01L 27/12* (2006.01)
  *G09G 3/325* (2016.01)

(52) U.S. Cl.
  CPC ...... *H01L 27/3206* (2013.01); *H01L 27/3265* (2013.01); *H01L 27/3272* (2013.01); *H01L 27/3276* (2013.01); *H01L 51/5265* (2013.01); *H01L 51/5271* (2013.01); *G09G 3/325* (2013.01); *G09G 2300/0842* (2013.01); *G09G 2300/0861* (2013.01); *H01L 27/1214* (2013.01); *H01L 27/322* (2013.01)

(58) Field of Classification Search
  CPC .............. H01L 51/5271; H01L 27/322; H01L 27/1214
  See application file for complete search history.

(56) References Cited

U.S. PATENT DOCUMENTS

| | | |
|---|---|---|
| 2003/0189410 A1 | 10/2003 | Yamazaki et al. |
| 2004/0130513 A1 | 7/2004 | Miyazawa |
| 2008/0017860 A1 | 1/2008 | Kubota et al. |
| 2009/0289963 A1 | 11/2009 | Minami et al. |
| 2014/0267636 A1 | 9/2014 | Takagi et al. |

FOREIGN PATENT DOCUMENTS

| | | |
|---|---|---|
| JP | 2007-226184 A | 9/2007 |
| JP | 2009-282190 A | 12/2009 |
| JP | 2013-211147 A | 10/2013 |
| JP | 2014-174429 A | 9/2014 |

OTHER PUBLICATIONS

Jul. 17, 2018 Notice of Allowance issued in U.S. Appl. No. 15/815,295.

\* cited by examiner

ELECTRO-OPTICAL DEVICE AND ELECTRONIC APPARATUS

This is a continuation of U.S. application Ser. No. 15/815,295, filed Nov. 16, 2017, which is a continuation of U.S. application Ser. No. 15/422,976, filed Feb. 2, 2017, which claims the benefit of Japanese Application No. 2016-025617, filed Feb. 15, 2016. The disclosures of the prior applications are hereby incorporated by reference in their entireties.

BACKGROUND

1. Technical Field

The present disclosure relates to an electro-optical device and an electronic apparatus.

2. Related Art

Recently, an electro-optical device which uses an organic light emitting diode (OLED) as a light emitting element has been used in an electronic apparatus which can form a virtual image, such as a head mounted display. In such an electro-optical device, as disclosed in JP-A-2013-211147, a technology using a color filter is proposed as one of technologies which realize color display.

In this technology, emitted light beams of red color, green color, and blue color are obtained through color filters of three primary colors, that is, red, green, and blue, by using an OLED which emits white light as a light source. A combination of an OLED and a filter for any color of the three primary colors is assumed to be a subpixel, and a combination of subpixels of the three primary colors is assumed to be a pixel. Such pixels are arranged in matrix so as to constitute a screen of a display device. A method in which subpixels for the same colors are arranged in a vertical direction (up-and-down direction) or in a transverse direction (right-and-left direction) is known as an arrangement method of the pixels.

However, the light emitted from the OLED which emits white light is diffused light. A transparent layer having a certain thickness which is formed by an inorganic film or a resin film for sealing the OLED is provided between the OLED and the color filter. Thus, in the color filter type electro-optical device, there is a problem that a portion of light emitted from an OLED of a certain subpixel is transmitted through a color filter of an adjacent subpixel, and thus color mixing occurs depending on an angle at which a screen is observed.

In a technology in which subpixels of the same color are arranged in a vertical direction (up-and-down direction) of a screen, even though the screen is observed at an inclined angle, color shift hardly occurs regarding the vertical direction. Regarding a transverse (right-and-left) direction, in a case where a panel is observed at an inclined angle, color-mixed light such as light of mixed color of red and green, light of mixed color of red and blue, and light of mixed color of green and blue is visually recognized. Thus, the color shift occurs in comparison to a case of being observed from the front.

JP-A-2013-211147 proposes that reflection electrodes of subpixels of red and green are arranged in the transverse direction (right-and-left direction), and a reflection electrode of a subpixel of blue is disposed in a direction (up-and-down direction) perpendicular to the reflection electrodes of subpixels of red and green.

However, in the electro-optical device disclosed in JP-A-2013-211147, scanning lines for subpixels of colors are arranged in the vertical direction (up-and-down direction), and thus the number of scanning lines selected for one horizontal scanning period is increased. As a result, time to select each of the scanning lines in the one horizontal scanning period becomes shorter, and thus writing from a data transfer line to a pixel may be difficult.

As in JP-A-2013-211147, the width of a reflective layer in a transverse direction (right-and-left direction) in a subpixel of blue is shorter than the width of the reflective layer in the transverse direction (right-and-left direction) in one pixel obtained by combining a subpixel of red and a subpixel of green. Thus, blue light is applied to a transistor, and thus transistor characteristics may be changed.

SUMMARY

An advantage of some aspects of the embodiment is to provide an electro-optical device which can prevent applying of light from a light emitting layer to a transistor and prevent reducing of a selection time of each scanning line even though subpixels of at least one color are arranged in the transverse (right and left) direction, and to provide an electronic apparatus including the electro-optical device.

According to an aspect of the embodiment, an electro-optical device includes a plurality of first conductive layers each of which is extended in a first direction, a plurality of second conductive layers each of which is extended in a second direction, and a plurality of subpixels each of which is arranged to corresponding intersection between the plurality of first conductive layers and the plurality of second conductive layers. Each of the plurality of subpixels includes a third conductive layer of a light emitting element and a plurality of transistors. Subpixels of the plurality of subpixels which are adjacent to each other in the first direction, and have different display colors is set as one pixel unit. The plurality of transistors is disposed in a pixel circuit region of which a width in the first direction is narrower than a width in the second direction. The third conductive layer of at least one subpixel among the plurality of subpixels included in the one pixel unit has a width in the first direction, which is narrower than a width in the second direction, and overlaps at least one transistor among the plurality of transistors included in the one pixel unit. One conductive layer among the plurality of first conductive layers is electrically connected to transistors which are at least one of the plurality of transistors included in each of the plurality of subpixels which are included in the one pixel unit. When a region surrounded by a first virtual line, a second virtual line, a third virtual line, and a fourth virtual line is defined to be a disposition region of transistors, the first virtual line passing through an edge of an active region of a transistor which is positioned at an end of one direction of the first direction, in the one direction of the first direction, the second virtual line passing through an edge of an active region of a transistor which is positioned at an end of another direction of the first direction, in the other direction of the first direction, the third virtual line passing through an edge of an active region of a transistor which is positioned at an end of one direction of the second direction, in the one direction of the second direction, and the fourth virtual line passing through an edge of an active region of a transistor which is positioned at an end of another direction of the second direction, in the other direction of the second direction, among the plurality of transistors included in the one pixel unit. When a region surrounded by a fifth virtual line, a sixth virtual line, a seventh virtual line, and an eighth virtual line is defined as a disposition region of third conductive layers, the fifth virtual line passing through an edge of a third conductive layer which is positioned at an end of one direction of the first direction, in the one direction of the first direction, the sixth virtual line passing through an edge of a third conductive layer positioned at an end of another direction of the first direction, in the other direction of the first direction, the seventh virtual line passing through an edge of a third conductive layer positioned at an end of one direction of the second direction, in the one direction of the second direction, and the eighth virtual line passing through an edge of a third conductive layer positioned at an end of another direction of the second direction, in the other direction of the second direction, among the plurality of third conductive layers included in the one pixel unit. A center position of the disposition region of the third conductive layers is different from a center position of the disposition region of the transistors.

According to the aspect of the embodiment, the third conductive layer of at least one subpixel (for example, a reflective layer) has a width in a first direction (for example, row direction) which is wider than the width in a second direction (for example, column direction). For example, a reflective layer as an example of the third conductive layer in a subpixel of a blue display color has a width in the first direction which is wider than the width in the second direction. Thus, in a case where a direction to which the main light line of the electro-optical device is largely inclined is designed so as to be set as the first direction, subpixels of the same color can be arranged in a first direction of a display surface. As a result, there is provided an electro-optical device in which color shift hardly occurs regarding the first direction, even though a display surface is observed at an inclined angle. In addition, the reflective layer as an example of the third conductive layer is disposed so as to overlap at least one transistor among the plurality of transistors included in the one pixel unit. Thus, light from the light emitting layer is blocked by the reflective layer as an example of the third conductive layer, and thus applying of the light to at least one transistor is prevented.

The center position of the disposition region of the transistors, which is defined as a region surrounded by the first, second, third, and fourth virtual lines is different from the center position of the disposition region of third conductive layers, which is surrounded by the fifth, sixth, seventh, and eighth virtual lines. Thus, the third conductive layer can be disposed so as to enable reliable block of light applied to the transistor.

In the electro-optical device according to the above-described aspect, the plurality of first conductive layers may be scanning lines. According to this aspect, the plurality of transistors in a subpixel of each display color is disposed in the pixel circuit region of which the width in the first direction is narrower than the width in the second direction. Thus, it is possible to commonly use a scanning line for the subpixel of each display color. Accordingly, reducing the selection time of each scanning line in one horizontal scanning period is prevented without an increase of the number of scanning lines.

In the electro-optical device according to the above-described aspect, a fourth conductive layer extended in the first direction is disposed in the one pixel unit. The fourth conductive layer is disposed so as to overlap at least one transistor of the plurality of transistors included in the one pixel unit in a plan view, and the fourth conductive layer may be disposed between the third conductive layer of at least one subpixel included in the one pixel unit, and the at least one transistor. According to this aspect, the fourth conductive layer, for example, a power source wiring is disposed between the third conductive layer and the transistor overlapping the third conductive layer, along the first direction so as to overlap the transistor in a plan view. Thus, light from the light emitting layer is also blocked by the power source wiring as an example of the fourth conductive layer, and thus applying of the light to the transistor is prevented.

In the electro-optical device according to the above-described aspect, the fourth conductive layer may be a power source wiring which is connected to the transistor. According to this aspect, light from the light emitting layer is also blocked by the power source wiring, and thus applying of the light to the transistor is prevented. As a result, a light emitting element stably drives without changing the characteristics of the transistor.

In the electro-optical device according to the above-described aspect, the seventh virtual line or the eighth virtual line may be set to overlap the fourth conductive layer in a plan view. According to this aspect, an edge which is a side of the third conductive layer and is positioned at an end of one direction of the second direction or an edge which is a side of the third conductive layer and is positioned at an end of another direction of the second direction overlaps the fourth conductive layer in a plan view. Thus, the third conductive layer and the fourth conductive layer overlap the transistor so as to have no gap in the first direction in a plan view. Accordingly, light from the light emitting layer is reliably blocked by the third conductive layer and the fourth conductive layer, and thus applying of the light to the transistor is prevented. As a result, a light emitting element stably drives without changing the characteristics of the transistor.

In the electro-optical device according to the above-described aspect, the entirety of the third conductive layer of at least one subpixel may be set to overlap the fourth conductive layer in a plan view. According to this aspect, at least one third conductive layer and fourth conductive layer overlap the transistor so as to have no gap in a plan view. Thus, light from the light emitting layer is reliably blocked by the third conductive layer and the fourth conductive layer, and thus applying of the light to the transistor is prevented. As a result, a light emitting element stably drives without changing the characteristics of the transistor.

In the electro-optical device according to the above-described aspect, a fifth conductive layer which is connected to a gate layer of at least one transistor among the plurality of transistors included in the plurality of subpixels which are included in the one pixel unit, and is extended in the first direction may be provided. Two third conductive layers which are adjacent to each other in the second direction among the plurality of third conductive layers included in the one pixel unit may have sides which face each other in the second direction, and overlap the fifth conductive layer or one conductive layer of the plurality of first conductive layers in a plan view. According to this aspect, the two third conductive layers which are adjacent to each other in the second direction overlap the fifth conductive layer or one first conductive layer of the plurality of first conductive layers, so as to have no gap in a plan view. Thus, light from the light emitting layer is reliably blocked by at least two third conductive layers, and the fifth conductive layer or one first conductive layer of the plurality of first conductive layers, and thus applying of the light to the transistor is prevented. As a result, a light emitting element stably drives without changing the characteristics of the transistor.

In the electro-optical device according to the above-described aspect, the fifth virtual line or the sixth virtual line may be set to overlap the second conductive layer in a plan view. According to this aspect, an edge which is a side of the third conductive layer and is positioned at an end of one direction of the first direction or an edge which is a side of the third conductive layer and is positioned at an end of another direction of the first direction overlaps the second conductive layer in a plan view. Thus, the third conductive layer and the second conductive layer overlap each other so as to have no gap in the second direction in a plan view. Accordingly, light from the light emitting layer is reliably blocked by the third conductive layer and the second conductive layer, and thus applying of the light to the transistor is prevented. As a result, a light emitting element stably drives without changing the characteristics of the transistor.

In the electro-optical device according to the above-described aspect, a sixth conductive layer which has a constant potential and is extended in the second direction may be provided. The first virtual line or the second virtual line may be set to overlap the sixth conductive layer in a plan view. According to this aspect, an edge which is a side of the third conductive layer and is positioned at an end of one direction of the first direction or an edge which is a side of the third conductive layer and is positioned at an end of another direction of the first direction overlaps the sixth conductive layer in a plan view. Thus, the third conductive layer and the sixth conductive layer overlap each other so as to have no gap in the second direction in a plan view. Accordingly, the light from the light emitting layer is reliably blocked by the third conductive layer and the sixth conductive layer, and thus applying of the light to the transistor is prevented. As a result, a light emitting element stably drives without changing the characteristics of the transistor.

Next, according to another aspect of the embodiment, an electronic apparatus includes the electro-optical device according to the above-described aspects of the embodiment. Regarding such an electronic apparatus, there is an electronic apparatus which has high image quality and in which the electro-optical device including a light emitting element such as an OLED is provided, and thus no color shift occurs, the characteristics of the transistor occurring by light from the light emitting layer is not changed, and writing from the data transfer line to a pixel is reliably performed.

BRIEF DESCRIPTION OF THE DRAWINGS

The embodiment will be described with reference to the accompanying drawings, wherein like numbers reference like elements.

DESCRIPTION OF EXEMPLARY EMBODIMENTS

Figure 1:
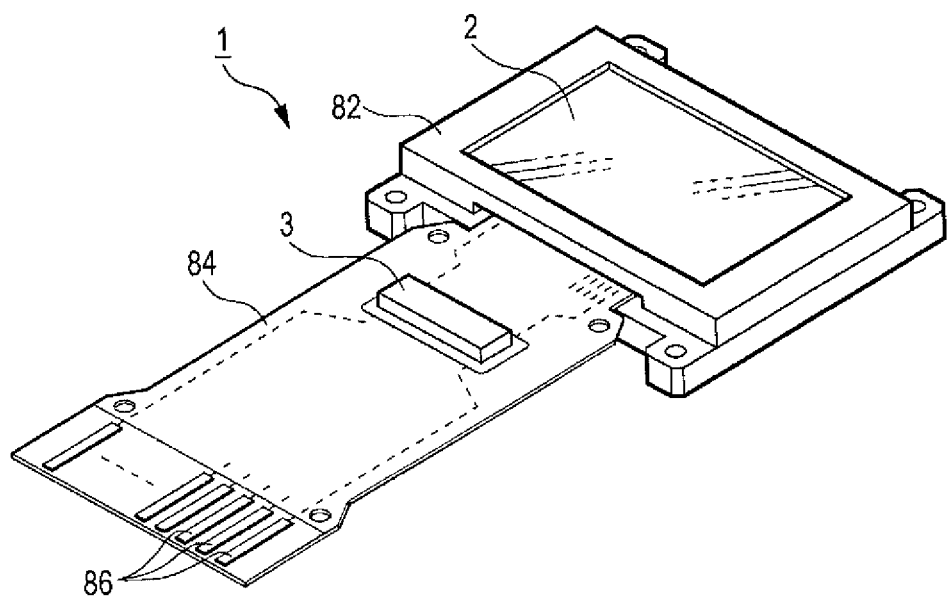
FIG. 1 is a perspective view illustrating an electro-optical device according to a first exemplary embodiment.

Exemplary embodiments will be described with reference to the drawings. In the following drawings, a scale for each layer or each member varies in order to enlarge each layer or each member as large as can be recognized in the drawings.

First Exemplary Embodiment

FIG. 1 is a perspective view illustrating a configuration of an electro-optical device 1 according to a first exemplary embodiment. The electro-optical device 1 is, for example, a micro-display which displays an image in a head mounted display.

As illustrated in FIG. 1, the electro-optical device 1 includes a display panel 2, and a control circuit 3 for controlling an operation of the display panel 2. The display panel 2 includes a plurality of pixel circuits and a drive circuit for driving the pixel circuits. In the exemplary embodiment, the plurality of pixel circuits and the drive circuit provided in the display panel 2 are formed on a silicon substrate, and an OLED which is an example of a light emitting element is used as the pixel circuit. The display panel 2 is stored in, for example, a frame-like case 82 which is open in a display unit, and is connected to one end of a flexible printed circuit (FPC) substrate 84.

The control circuit 3 having a form of a semiconductor chip is mounted on the FPC substrate 84 by the chip-on-film (COF) technology. The FPC substrate 84 has a plurality of terminals 86 provided thereon, and is connected to a higher circuit (not illustrated).

Figure 2:
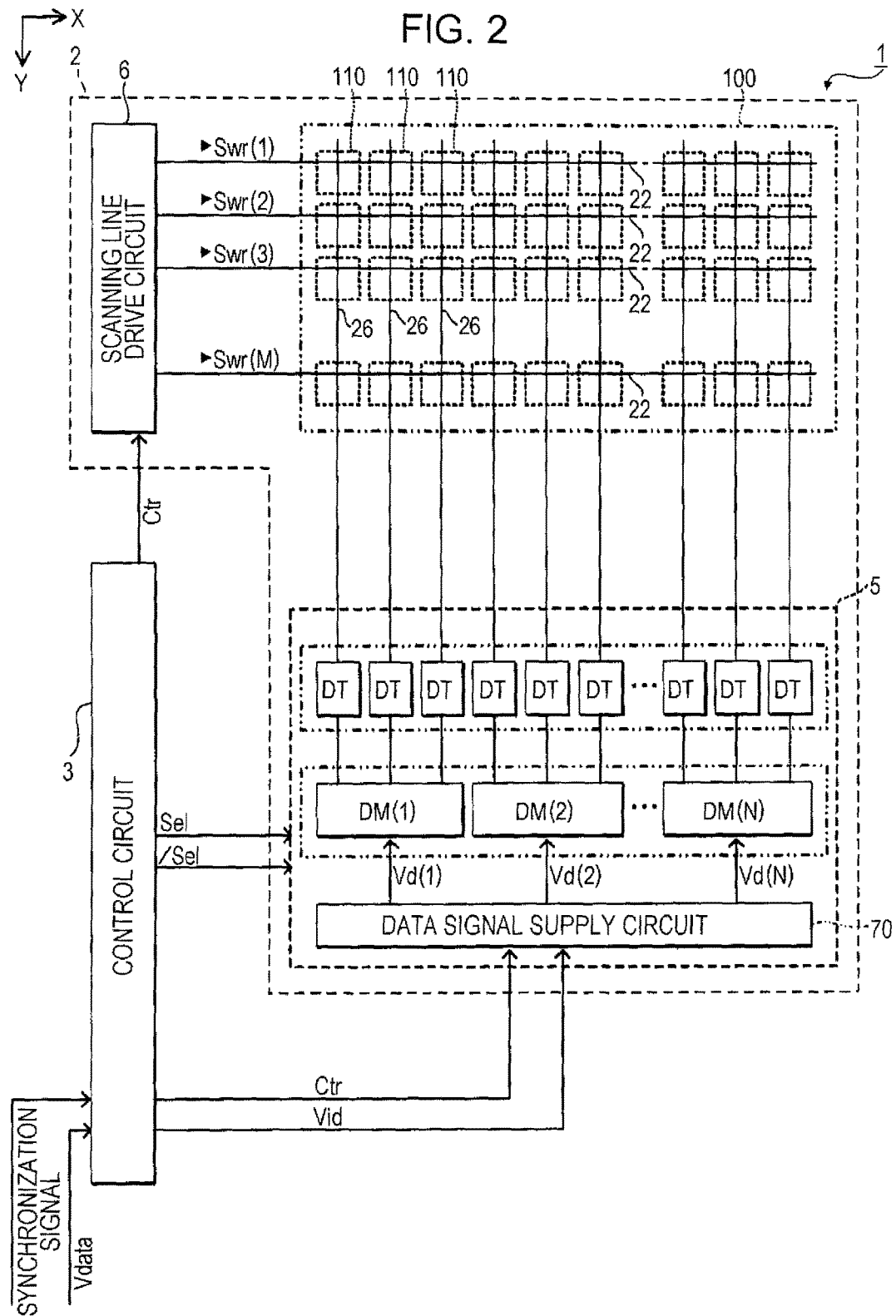
FIG. 2 is a block diagram illustrating a configuration of the electro-optical device according to the first exemplary embodiment.

FIG. 2 is a block diagram illustrating a configuration of the electro-optical device 1 according to the exemplary embodiment. As described above, the electro-optical device 1 includes the display panel 2 and the control circuit 3.

Digital image data Vdata is supplied to the control circuit 3 with synchronization with a synchronization signal, by the higher circuit (not illustrated). Here, the image data Vdata is data of which a gray scale level of a pixel of an image to be displayed in the display panel 2 (strictly, display unit 100 which will be described later) is defined to, for example, be 8 bits. The synchronization signal is a signal including a vertical synchronization signal, a horizontal synchronization signal, and a dot clock signal.

The control circuit 3 generates various control signals based on the synchronization signal, and supplies the generated signals to the display panel 2. Specifically, the control circuit 3 supplies a control signal Ctr, control signals Sel(1), Sel(2), and Sel(3), and control signals /Sel(1), /Sel(2), and /Sel(3) which have a relationship of logic inversion with the control signals Sel(1), Sel(2), and Sel(3), to the display panel 2.

Here, the control signal Ctr is a signal including a pulse signal or a plurality of signals of a clock signal, an enable signal, and the like.

The control signals Sel(1), Sel(2), and Sel(3) may be collectively referred to as a control signal Sel, and the control signals /Sel(1), /Sel(2), and /Sel(3) may be collectively referred to as a control signal /Sel.

The control circuit 3 generates an analog image signal Vid based on the image data Vdata. Specifically, a lookup table in which a potential indicating the image signal Vid and luminance of the light emitting element (OLED which will be described later) provided in the display panel 2 are stored in correlation with each other is provided in the control circuit 3. The control circuit 3 generates the image signal Vid indicating a potential which corresponds to luminance of the light emitting element, which is defined in the image data Vdata, with reference to the lookup table. The control circuit 3 supplies the generated image signal Vid to the display panel 2.

As illustrated in FIG. 2, the display panel 2 includes the display unit 100 and a drive circuit (data transfer line drive circuit 5 and scanning line drive circuit 6) for driving the display unit 100.

The pixel circuits 110 which respectively correspond to pixels of an image to be displayed are arranged in matrix, in the display unit 100. In detail, scanning lines 22 of M rows as first conductive layers are provided in the display unit 100, so as to be extended in a first direction of FIG. 2, for example, in a row direction (X direction). In addition, data transfer lines 26 of (3N) column obtained by grouping each of three data transfer lines, as second conductive layers are provided so as to be extended in a second direction of FIG. 2, for example, a column direction (Y direction), and to hold electrical insulation between the scanning lines 22. In the exemplary embodiment, the pixel circuits 110 are arranged in a matrix of M rows×(3N) columns.

Here, both of M and N are integers. The scanning lines 22 and the pixel circuits 110 may be referred to as a first row, a second row, a third row, . . . , a (M−1)th row, and a Mth row in an order from the top in FIG. 2, in order to distinguish the rows in the matrix of the scanning lines 22 and the pixel circuits 110. Similarly, the data transfer lines 26 and the pixel circuit 110 may be referred to as a first column, a second column, a third column, . . . , a (3N−1)th column, and a (3N)th column in an order from the left in FIG. 2, in order to distinguish the columns in the matrix of the data transfer lines 26 and the pixel circuits 110.

Here, in order to generalize and describe the group of the data transfer line 26, if a certain integer of 1 or more is indicated as n, the (3n−2)th, (3n−1)th, and (3n)th data transfer lines 26 belong to the n-th group when counted from the left.

Three pixel circuits 110 which correspond to the scanning line 22 in the same row, and the data transfer lines 26 of three columns belonging to the same group correspond to subpixels of display colors of G (green), R (red), and B (blue), respectively. The three pixel circuits 110 express one bit as one pixel unit of a color image to be displayed by these three subpixels. That is, in the exemplary embodiment, light is emitted from OLEDs corresponding to RGB, and thus a color of one dot is expressed by additive color mixing.

The scanning line drive circuit 6 generates a scanning signal Swr in accordance with the control signal Ctr. The scanning signal Swr is used for sequentially scanning the M pieces of scanning line 22 one by one for a period of one frame. Here, scanning signals Swr supplied to the scanning line 22 of the first row, the second row, the third row, . . . , the M-th row are described as Swr(1), Swr(2), Swr(3), . . . , Swr(M−1), and Swr(M), respectively.

The scanning line drive circuit 6 generates various control signals synchronized with the scanning signal Swr and supplies the generated control signals to the display unit 100, in addition to the scanning signals Swr(1) to Swr(M). However, illustrations relating to this are omitted in FIG. 2. The period of a frame is referred to as a period required for causing the electro-optical device 1 to display an image of one cut (frame). For example, if a frequency of the vertical synchronization signal included in the synchronization signal is 120 Hz, the period of a frame is a period of 8.3 milliseconds corresponding to one cycle of the vertical synchronization signal.

The data transfer line drive circuit 5 includes (3N) pieces of data transfer circuits DT, N pieces of demultiplexers DM, and a data signal supply circuit 70. The data transfer circuits DT are provided so as to have one-to-one correspondence with the data transfer lines 26 of (3N) columns. The demultiplexers DM are provided for each of data transfer lines 26 of three columns constituting each group.

The data signal supply circuit 70 generates data signals Vd(1), Vd(2), . . . , and Vd(N) based on the image signal Vid and the control signal Ctr which are supplied by the control circuit 3. That is, the data signal supply circuit 70 generates the data signals Vd(1), Vd(2), . . . , and Vd(N) based on the image signal Vid obtained by performing time division multiplexing of the data signals Vd(1), Vd(2), . . . , and Vd(N). The data signal supply circuit 70 supplies the data signals Vd(1), Vd(2), . . . , and Vd(N) to the demultiplexer DM corresponding to the first, second, . . . , and N-th groups, respectively. The demultiplexer DM turns ON/OFF in accordance with the control signal Sel and the control signal /Sel from the control circuit 3, and sequentially supplies data signals to the data transfer line 26 of three columns constituting each group.

Figure 3:
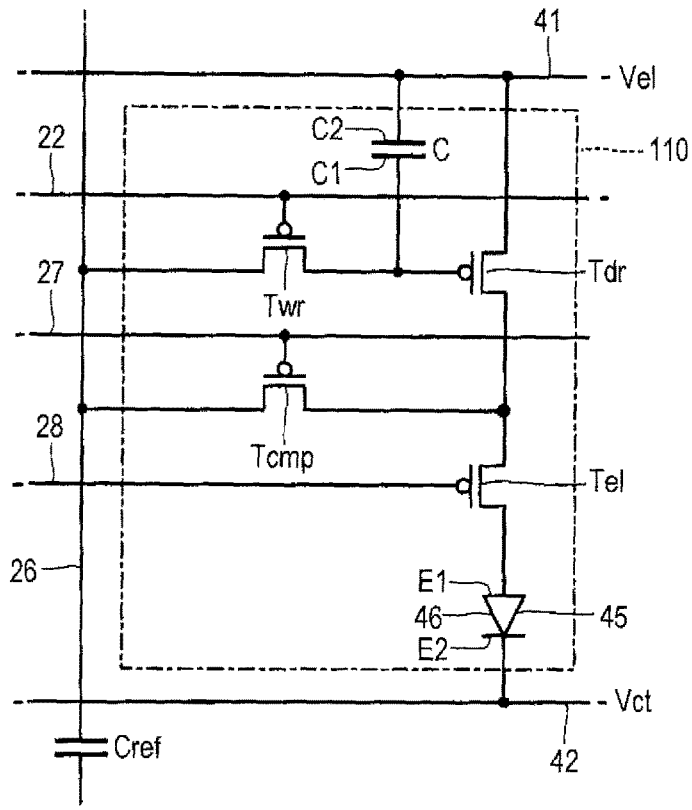
FIG. 3 is a circuit diagram illustrating a configuration of a pixel circuit.

FIG. 3 is a circuit diagram illustrating the pixel circuit 110 of each subpixel positioned in the display unit 100. As illustrated in FIG. 3, the pixel circuit 110 includes a light emitting element 45, a drive transistor Tdr, a writing control transistor Twr, a capacitive element C, a light-emitting control transistor Tel, and a compensation transistor Tcmp. In the exemplary embodiment, the transistors (Tdr, Tel, Twr, and Tcmp) of the pixel circuit 110 are set to be P-channel type transistors, but N-channel type transistors may be also used.

The light emitting element 45 is an electro-optical element in which a light-emitting function layer 46 including a light emitting layer of an organic EL material (OLED) is interposed between a first electrode (anode) E1 and a second electrode (cathode) E2. The first electrode E1 is separately formed in each of the pixel circuits 110, and the second electrode E2 is formed so as to continue over the plurality of pixel circuits 110. As understood from FIG. 3, the light emitting element 45 is disposed on a path of linking the first power conducting member (below set to be a power source wiring) 41 as a fourth conductive layer, and a second power conducting member 42. A power source potential Vel on a high potential side is supplied to the power source wiring 41. A power source potential (for example, ground potential) Vct on a low potential side is supplied to the second power conducting member 42. The pixel circuit 110 in the exemplary embodiment may be driven by either of so-called the coupling driving method and so-called the current programming method. Firstly, driving by the coupling driving method will be described.

The light-emitting control transistor Tel functions as a switch for controlling a conduction state (conduction/unconduction) between one (drain or source) of a pair of current ends of the drive transistor Tdr, and the first electrode E1 of the light emitting element 45. The drive transistor Tdr generates a drive current which has a current quantity depending on a gate-source voltage of the drive transistor Tdr. In a state where the light-emitting control transistor Tel is controlled to be in an ON state, the drive current is supplied to the light emitting element 45 from the drive transistor Tdr through the light-emitting control transistor Tel, and thus the light emitting element 45 emits light with luminance depending on the current quantity of the drive current. In a state where the light-emitting control transistor Tel is controlled to be in an OFF state, the supply of the drive current to the light emitting element 45 is blocked, and thus the light emitting element 45 goes out. The gate of the light-emitting control transistor Tel is connected to the control line 28.

The compensation transistor Tcmp has a function to perform compensation for fluctuation of a threshold voltage of the drive transistor Tdr. In the state where the light-emitting control transistor Tel is in the OFF state, and in a state where the writing control transistor Twr and the drive transistor Tdr are controlled to be in the ON state, operations as follows are performed. If the compensation transistor Tcmp is controlled to be in the ON state, the gate potential of the drive transistor Tdr is equal to the drain potential or the source potential, and thus the drive transistor Tdr is diode-connected. Thus, a current flowing in the drive transistor Tdr charges a gate node and the data transfer line 26. In detail, the current flows on a path of power source wiring 41→drive transistor Tdr→compensation transistor Tcmp-→data transfer line 26. Thus, potentials of the data transfer line 26 and the gate node which are in a connection state to each other by the drive transistor Tdr being controlled to be in the ON state rise from the potentials in an initial state. However, if the threshold voltage of the drive transistor Tdr is set to be |vth|, it is difficult to cause the current flowing on the path to flow as the potential of the gate node is approximate to a potential (Vel-|Vth|). As a result, the data transfer line 26 and the gate node are saturated at a potential (Vel-|th|) until a compensation period in which the compensation transistor Tcmp is in the OFF state is ended. Accordingly, the capacitive element C holds the threshold voltage |Vth| of the drive transistor Tdr until the compensation period in which the compensation transistor Tcmp is in the OFF state is ended.

In the exemplary embodiment, the compensation period and a writing period are provided in the horizontal scanning period. The scanning line drive circuit 6 respectively supplies the scanning signals to the scanning lines 22, and thus sequentially selects each of the plurality of scanning lines 22 for each horizontal scanning period. A writing control transistor Twr of the pixel circuit 110 corresponding to the scanning line 22 which has been selected by the scanning line drive circuit 6 transitions to the ON state. Accordingly, a drive transistor Tdr of each of the pixel circuits 110 transitions to the ON state. The scanning line drive circuit 6 respectively supplies control signals to the control lines 27, and thus sequentially selects each of the plurality of control lines 27 for each compensation period. A compensation transistor Tcmp of the pixel circuit 110 corresponding to the control line 27 which has been selected by the scanning line drive circuit 6 transitions to the ON state. Thus, the capacitive element C holds the threshold voltage |Vth| of the drive transistor Tdr until the compensation period in which the compensation transistor Tcmp is in the OFF state is ended. If the scanning line drive circuit 6 respectively supplies control signals to the control lines 27, and thus the compensation transistor Tcmp of the pixel circuit 110 is controlled to be in the OFF state, a path from the data transfer line 26 to the gate node of the drive transistor Tdr is in a floating state. However, the potential is maintained to be (Vel-|Vth|) by the capacitive element C. Then, the data transfer line drive circuit 5 supplies a grayscale potential (data signal) to the capacitive element Cref in parallel for each writing period. The grayscale potential (data signal) depends on a grayscale designated to each of the pixel circuits 110 by an image signal supplied from an external circuit. Thus, the level of the grayscale potential is shifted by using the capacitive element Cref, and the potential having the shifted level is supplied to the gate of the drive transistor Tdr of each of the pixel circuits 110 through the data transfer line 26 and the writing control transistor Twr. A voltage which depends to the grayscale potential with compensation of the threshold voltage |Vth| of the drive transistor Tdr is held at the capacitive element C. If selection of the scanning line 22 in the writing period is ended, the scanning line drive circuit 6 supplies the control signal to each of the control lines 28, and thus controls the light-emitting control transistor Tel of the pixel circuit 110 corresponding to the control line 28 to be in the ON state. Accordingly, the drive current depending on the voltage which has been held at the capacitive element C in the just previous writing period is supplied to the light emitting element 45 from the drive transistor Tdr through the light-emitting control transistor Tel. As described above, each of the light emitting elements 45 emits light with luminance depending on the grayscale potential, and thus a certain image designated by an image signal is displayed in the display unit 100. Regarding the drive current supplied to the light emitting element 45 from the drive transistor Tdr, an influence of the threshold voltage is cancelled, and thus compensation for variation thereof is performed even when the threshold voltage of the drive transistor Tdr varies for each of the pixel circuits 110. Since the current depending on a grayscale level is supplied to the light emitting element 45, and thus an occurrence of display unevenness such as damage of uniformity on a display screen is suppressed. As a result, display having high quality is possible.

Figure 4:
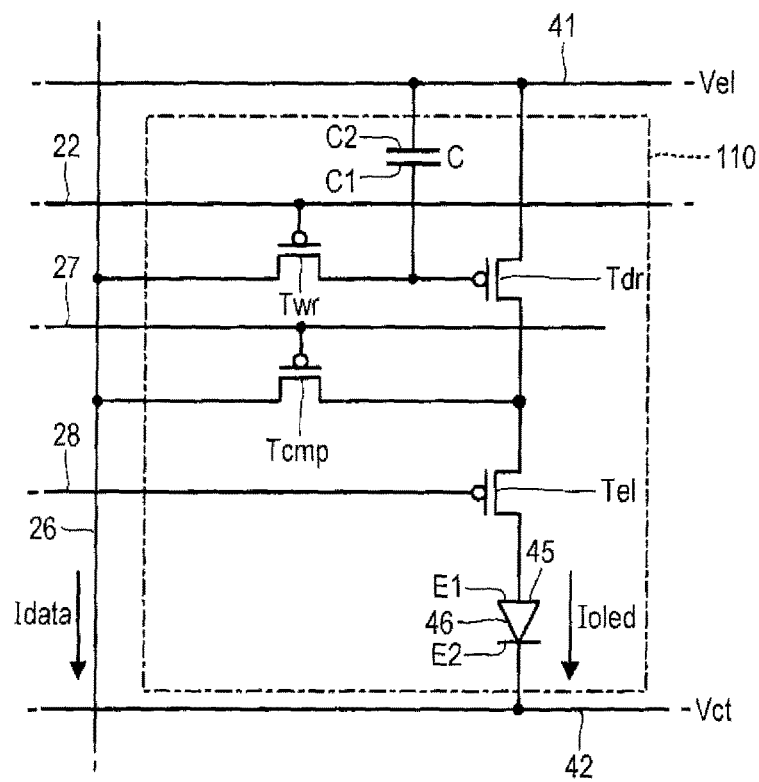
FIG. 4 is a circuit diagram illustrating a configuration of the pixel circuit.

Next, driving by the current programming method will be described with reference to FIG. 4. If the scanning signal of the scanning line 22 has an L level, the writing control transistor Twr turns in the ON state. If the control signal of the control line 27 has an L level, the compensation transistor Tcmp turns in the ON state. Thus, in the drive transistor Tdr, the gate potential is equal to the source potential or the drain potential on a connection side with the light-emitting control transistor Tel, and thus the drive transistor Tdr functions as a diode. If the data signal of the data transfer line 26 has an L level, a current Idata flows on a path of power source wiring 41→drive transistor Tdr→compensation transistor Tcmp→data transfer line 26. At this time, charges depending on the potential at the gate node of the drive transistor Tdr are accumulated in the capacitive element C.

If the control signal of the control line 27 has a H level, the compensation transistor Tcmp turns in the OFF state. At this time, a voltage between both ends of the capacitive element C is maintained to be a voltage when the current Idata flows. If the control signal of the control line 28 has an L level, the light-emitting control transistor Tel turns in the ON state, and a current Ioled depending on the gate voltage flows between the source and the drain of the drive transistor Tdr. In detail, the current Ioled flows on a path of power source wiring 41→drive transistor Tdr→light-emitting control transistor Tel→light emitting element 45.

The current Ioled which flows in the light emitting element 45 is determined by a voltage between the gate node of the drive transistor Tdr, and a drain node or a source node on the connection side with the power source wiring 41. The voltage is a voltage held by the capacitive element C when the current Idata flows in the data transfer line 26 by the scanning signal of an L level. Thus, when the control signal of the control line 28 has an L level, the current Ioled which flows in the light emitting element 45 is substantially equal to the current Idata which has flown just before. In this manner, in a case of driving by the current programming method, luminance of emitted light is defined by the current Idata. The scanning line 22 is set to be a wiring different from the control line 27. However, the scanning line 22 and the control line 27 may be used as one piece of wiring.

Figure 5:
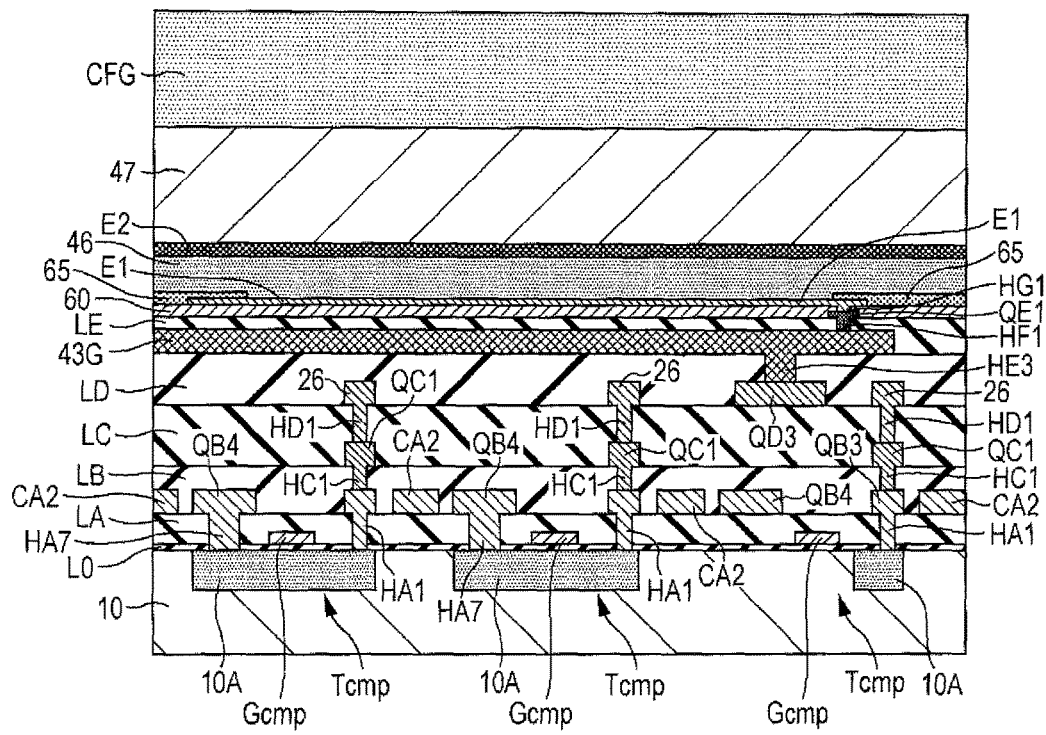
FIG. 5 is a sectional view of a pixel of one pixel unit in a row direction.
Figure 6:
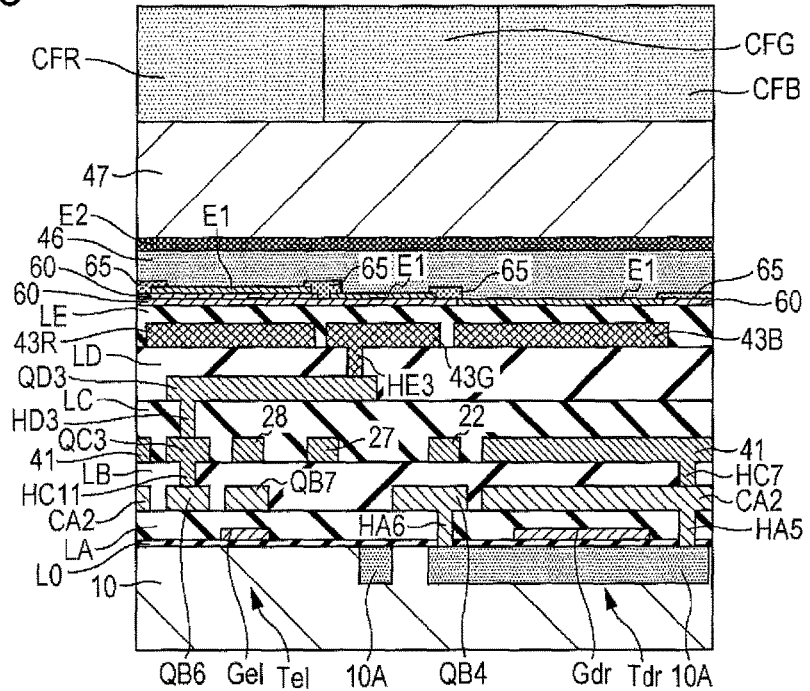
FIG. 6 is a sectional view of a subpixel in a column direction.

A specific structure of the electro-optical device 1 according to the first exemplary embodiment will be described below in detail. In the drawings which are used as a reference in the following descriptions, for convenient descriptions, dimensions or scales of components are different from those of a practical electro-optical device 1. FIG. 5 is a sectional view corresponding to a section including V-V line in FIGS. 7 to 11. FIG. 6 is a sectional view corresponding to a section including VI-VI line in FIGS. 7 to 11. FIGS. 7 to 11 are plan views illustrating a form of a surface of a substrate 10 at each stage for forming components of the electro-optical device 1, focusing on two pixels in one pixel unit. FIGS. 7 to 11 are plan views. However, from a viewpoint of easily performing visual recognition of the components, hatching having the same shape in FIGS. 5 and 6 is added to components which are common in FIGS. 5 and 6.

Figure 7:
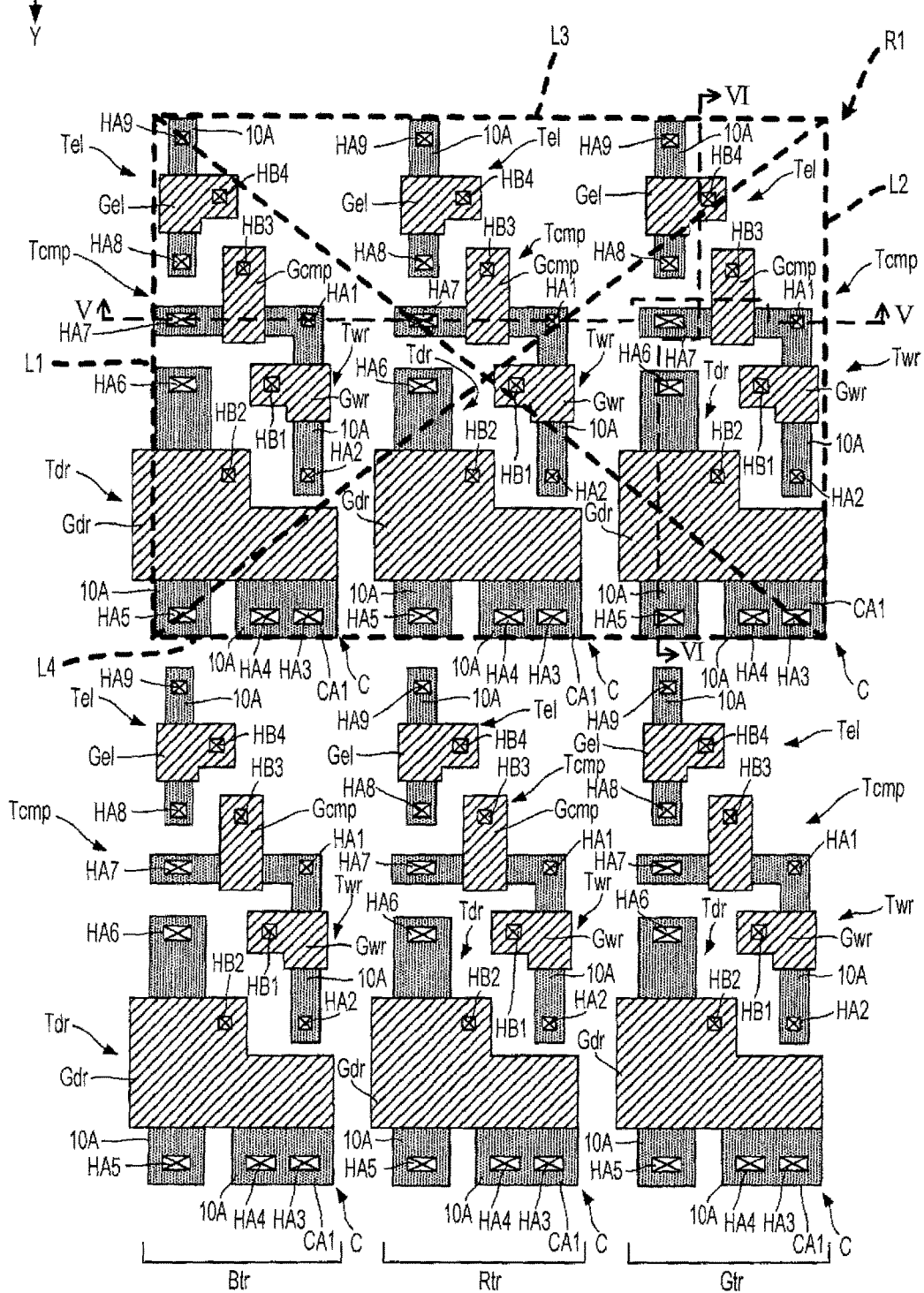
FIG. 7 is a diagram illustrating components formed on a substrate.

As understood from FIGS. 5, 6, and 7, an active region (source/drain region) 10A of each of the transistors Tdr, Twr, Tel, and Tcmp in the pixel circuit 110 is formed in the surface of the substrate 10. The substrate 10 is formed of a semiconductor material such as silicon. Ions are injected to the active region 10A. An active layer of each of the transistors Tdr, Twr, Tel, and Tcmp in the pixel circuit 110 is provided between the source region and the drain region, and ions of a type different from that in the active region 10A are injected to the active layer. However, for convenience, the active layer is illustrated so as to be integrated with the active region 10A. In the exemplary embodiment, the active region 10A is also formed in a region constituting the capacitive element C, impurities are injected to the active region 10A, and the active region 10A is connected to a power source. Thus, a so-called MOS capacitance in which the active region 10A is used as one electrode, and a capacitive electrode formed with an insulating layer is used as another electrode is configured. The active region 10A functions as a power source potential portion in the region constituting the capacitive element C. As understood from FIG. 7, the active region 10A of the compensation transistor Tcmp is joined to the active region 10A of the writing control transistor Twr in a portion at which a conduction hole HA1 is provided. Accordingly, the current end of the compensation transistor Tcmp also functions as a current end of the writing control transistor Twr. As understood from FIGS. 5 and 6, the surface of the substrate 10 in which the active region 10A is formed is covered with an insulating film (gate insulating film) L0, and gate layers G (Gdr, Gwr, Gel, and Gcmp) of the transistors are formed on a surface of the insulating film L0. The gate layer G of each of the transistors faces the active layer with the insulating film L0 interposed between the gate layer G and the active layer. As illustrated in FIG. 7, the gate layer Gdr of the drive transistor Tdr is formed to be extended to the active region 10A which is formed in the region constituting the capacitive element C, and the gate layer Gdr constitutes a lower capacitive electrode layer CA1.

In the exemplary embodiment, as illustrated in FIG. 7, in each of subpixels of G (green), R (red), and B (blue), the plurality of transistors Tdr, Twr, Tel, and Tcmp are disposed in a pixel circuit region of which the width in the row direction (X direction) is narrower than the width in the column direction. In FIGS. 7 to 11, in each subpixel of B (blue), a plurality of transistors is indicated by Btr. In each subpixel of R (red), a plurality of transistors is indicated by Rtr. In each subpixel of G (green), a plurality of transistors is indicated by Gtr.

A rectangular region indicated by a dot line in FIG. 7 represents a disposition region R1 of transistors in one pixel unit. In the exemplary embodiment, a virtual line which passes through a side of the active region 10A of the transistor and passes through a side of the active region 10A of the drive transistor Tdr positioned at an end of one direction side (left side in FIG. 7) in the row direction (X direction) is defined to be a first virtual line L1. A virtual line which passes through a side of the active region 10A of the capacitive element C positioned at an end of another direction side (right side in FIG. 7) in the row direction (X direction) is defined to be a second virtual line L2.

In the exemplary embodiment, a virtual line which passes through a side of the active region 10A of the light-emitting control transistor Tel positioned at an end of one direction side (upper side in FIG. 7) in the column direction (Y direction) is defined to be a third virtual line L3. A virtual line which passes through a side of the active region 10A of the drive transistor Tdr positioned at an end of another direction side (lower side in FIG. 7) in the column direction (Y direction) is defined to be a fourth virtual line L4.

In the exemplary embodiment, the disposition region R1 of transistors in one pixel unit is defined to be a region surrounded by the virtual lines, that is, the first virtual line L1, the second virtual line L2, the third virtual line L3, and the fourth virtual line L4.

As understood from FIGS. 5 and 6, a multilayer wiring layer in which a plurality of insulating layers L (LA to LE) and a plurality of conductive layers (wiring layers) are alternately stacked is formed on the surface of the insulating film L0 on which the gate layer G of each of the transistors, and the lower capacitive electrode layer CA1 are formed. Each of the insulating layers L is formed of, for example, an insulating inorganic material such as a silicon compound (typically, silicon nitride or silicon oxide). In the following descriptions, a relation in which a plurality of elements is integrally formed in the same process by selective removal of the conductive layer (single layer or plurality of layers) is described as "being formed from the same layer".

The insulating layer LA is formed on the surface of the insulating film L0 in which the gate layer G of each of the transistors is formed. As understood from FIGS. 5, 6, and 8, upper capacitive electrode layers CA2, CA3, and CA4 and a plurality of relay electrodes QB (QB2, QB3, QB4, QB5, QB6, and QB7) are formed on the surface of the insulating layer LA, from the same layer. As understood from FIGS. 5 to 8, the upper capacitive electrode layer CA2 is conducted the active region 10A which forms the source region or the drain region of the drive transistor Tdr, through a conduction hole HA5 which penetrates the insulating layer LA and the insulating film L0. An opening 50 is formed in the upper capacitive electrode layer CA2, so as to surround a region in which a portion of the gate layer Gdr of the drive transistor Tdr and the lower capacitive electrode layer CA1 are formed, in a plan view.

In the opening 50, the upper capacitive electrode layer CA3 and the upper capacitive electrode layer CA4 are formed in the same layer as that for the upper capacitive electrode layer CA2. An opening 52 is formed in the upper capacitive electrode layer CA3, and the upper capacitive electrode layer CA4 is formed in the opening 52. That is, the upper capacitive electrode layer CA2 and the upper capacitive electrode layer CA3 are formed so as to be separate from each other, and thus are electrically insulated. The upper capacitive electrode layer CA3 and the upper capacitive electrode layer CA4 are formed so as to be separate from each other, and thus are electrically insulated. The upper capacitive electrode layer CA3 also functions as a wiring layer for connecting the gate layer Gdr of the drive transistor Tdr with the drain region or the source region of the writing control transistor Twr. That is, as understood from FIGS. 5, 6, and 8, the upper capacitive electrode layer CA3 is conducted to the active region 10A of the writing control transistor Twr through a conduction hole HA2 which penetrates the insulating layer LA and the insulating film L0. In addition, the upper capacitive electrode layer CA3 is conducted to the gate layer Gdr of the drive transistor Tdr through a conduction hole HB2 of the insulating layer LA.

A relay electrode QB4 is formed at a conduction portion between the drive transistor Tdr and the compensation transistor Tcmp, and at a conduction portion between the drive transistor Tdr and the light-emitting control transistor Tel. The relay electrode QB4 is formed in the same layer as that for the upper capacitive electrode layer CA2. A relay electrode QB3 is formed at a conduction portion between the compensation transistor Tcmp and the writing control transistor Twr, in the same layer as that for the upper capacitive electrode layer CA2. A relay electrode QB5 is formed at a conduction portion of the gate layer Gcmp of the compensation transistor Tcmp, in the same layer as that for the upper capacitive electrode layer CA2. A relay electrode QB2 is formed at a conduction portion of the gate layer Gwr of the writing control transistor Twr, in the same layer as that for the upper capacitive electrode layer CA2. A relay electrode QB6 is formed at a conduction portion between the light-emitting control transistor Tel and the first electrode E1 as the pixel electrode, in the same layer as that for the upper capacitive electrode layer CA2. The relay electrode QB6 is formed at a conduction portion of the gate layer Gel of the light-emitting control transistor Tel, in the same layer as that for the upper capacitive electrode layer CA2.

Figure 8:
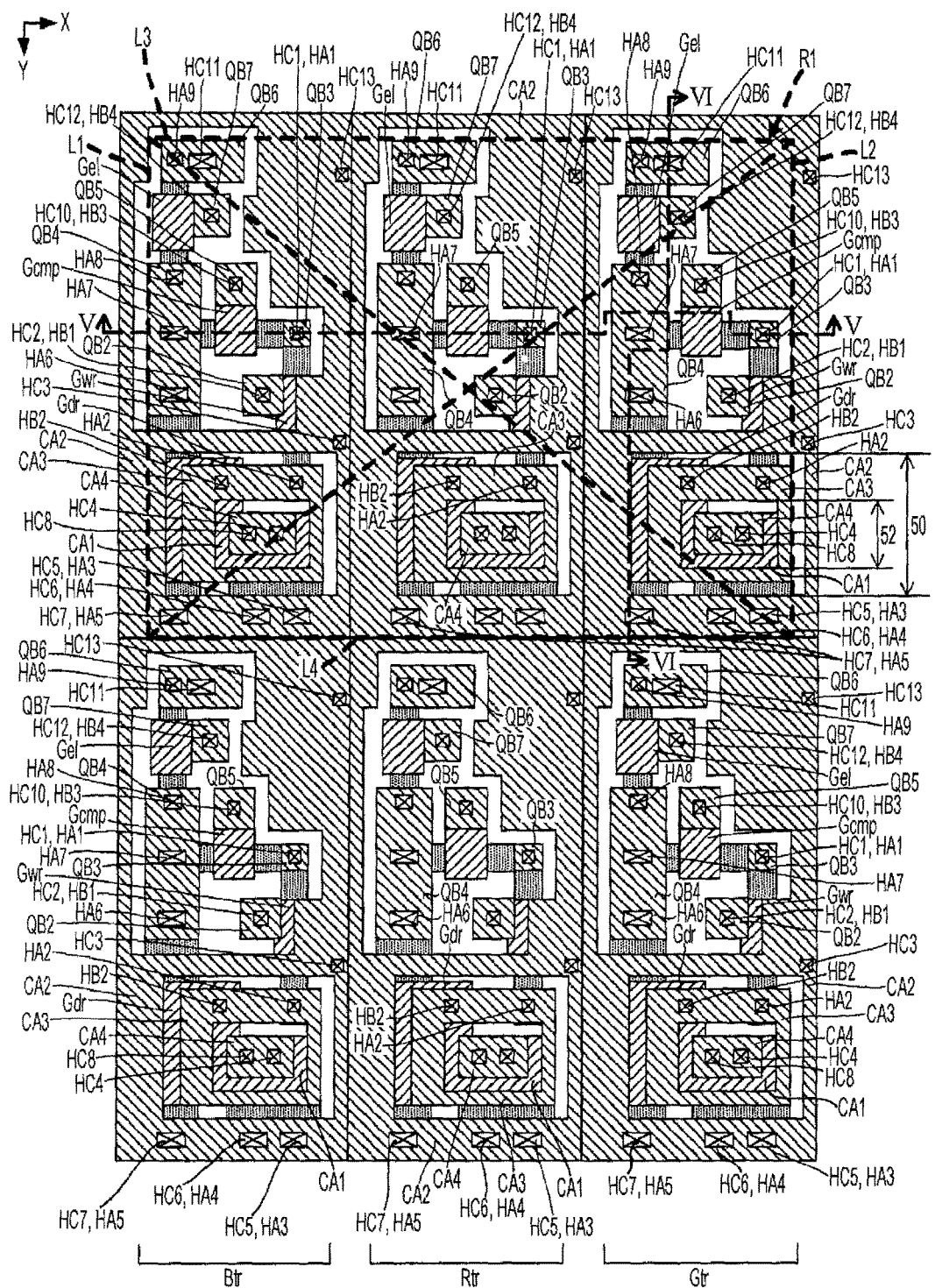
FIG. 8 is a diagram illustrating components formed on the substrate.

As understood from FIGS. 6 and 8, the relay electrode QB4 is conducted to the active region 10A which forms a drain region or a source region of the drive transistor Tdr, through a conduction hole HA6 which penetrates the insulating film L0 and the insulating layer LA. The relay electrode QB4 is conducted to the active region 10A which forms a drain region or a source region of the compensation transistor Tcmp, through a conduction hole HA7 which penetrates the insulating film L0 and the insulating layer LA. The relay electrode QB4 is electrically connected to the active region 10A which forms a drain region or a source region of the light-emitting control transistor Tel, through a conduction hole HA8 which penetrates the insulating film L0 and the insulating layer LA. The relay electrode QB2 is conducted to the gate layer Gwr of the writing control transistor Twr through a conduction hole HB1 which penetrates the insulating layer LA. The relay electrode QB3 forms the source region or the drain region of the writing control transistor Twr through the conduction hole HA1 which penetrates the insulating layer LA and the insulating film L0, and is electrically connected to the active region 10A which forms the source region or the drain region of the compensation transistor Tcmp. The relay electrode QB5 is conducted to the gate layer Gcmp of the compensation transistor Tcmp through the conduction hole HB3 which penetrates the insulating layer LA. The relay electrode QB6 is electrically connected to the active region 10A which forms the drain region or the source region of the light-emitting control transistor Tel, through a conduction hole HA9 which penetrates the insulating film L0 and the insulating layer LA. The relay electrode QB7 is conducted to the gate layer Gel of the light-emitting control transistor Tel through the conduction hole HB4 which penetrates the insulating layer LA.

The insulating layer LB is formed on the surface of the insulating layer LA on which the upper capacitive electrode layer CA2, the upper capacitive electrode layer CA3, the upper capacitive electrode layer CA4, and the plurality of relay electrodes QB (QB2, QB3, QB4, QB5, QB6, and QB7) are formed. As understood from FIGS. 5, 6, and 9, the power source wiring 41 as the fourth conductive layer, the scanning line 22, the control line 27 of the compensation transistor Tcmp, and the plurality of relay electrodes QC (QC1 and QC3) are formed on the surface of the insulating layer LB. The power source wiring 41 is electrically connected to a mount terminal to which the power source potential Vel on a high potential side is supplied, through a wiring (not illustrated) in the multilayer wiring layer. The power source wiring 41 is formed in a display region (not illustrated) of the display unit 100. Although not illustrated, another power source wiring is formed in a peripheral region of the display region. This power source wiring is conducted to a mount terminal to which the power source potential Vct on a low potential side is supplied, through a wiring (not illustrated)

in the multilayer wiring layer. The power source wiring 41 and the power source wiring to which the power source potential Vct on the low potential side is supplied are formed by a conductive material containing, for example, silver or aluminium, and are formed so as to have a film thickness of about 100 nm, for example.

The power source wiring 41 is a power source wiring to which the power source potential Vel on the high potential side is supplied, as described above. The power source wiring 41 covers the opening 50 of the upper capacitive electrode layer CA2 and the upper capacitive electrode layer CA2 around the opening 50 in each pixel, as understood from FIG. 9. The power source wiring 41 is formed to be extended to a position of a relay electrode QC3 of the adjacent pixel circuit 110 in the column direction (Y direction). An opening 53 is formed at a linking portion to the adjacent pixel circuit 110, and is disposed so as to surround a pixel electrode conduction portion (conduction portion between the light-emitting control transistor Tel and the relay electrode QC3). The power source wiring 41 is a pattern formed to continue between adjacent pixel circuits 110 in the row direction (X direction), without a gap.

Figure 9:
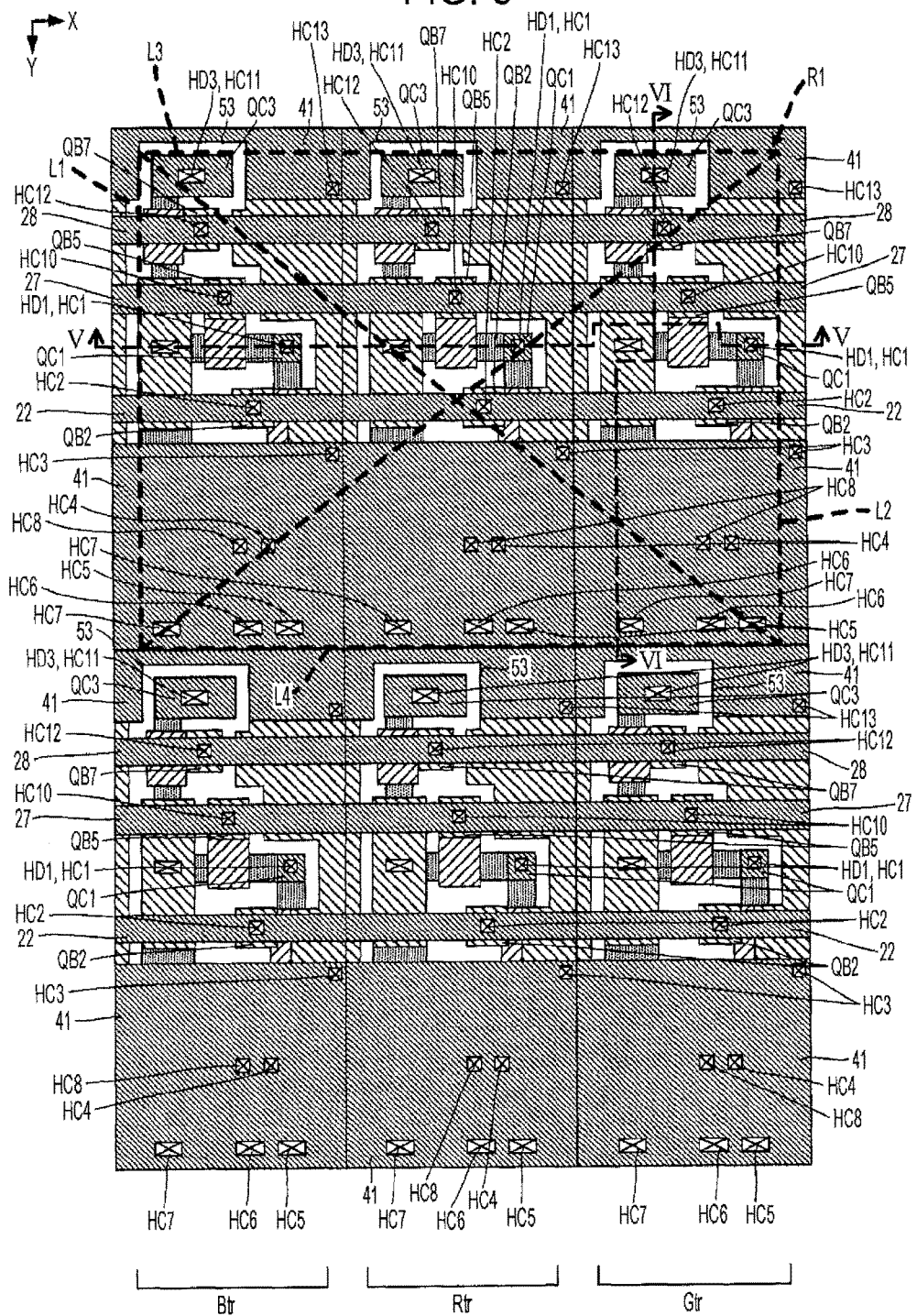
FIG. 9 is a diagram illustrating components formed on the substrate.

As understood from FIGS. 6 and 9, the power source wiring 41 formed in the display region is conducted to the upper capacitive electrode layer CA2 through conduction holes HC3 and HC13 which are formed in the insulating layer LB for each of the pixel circuits 110. The power source wiring 41 is conducted to the upper capacitive electrode layer CA2 through conduction holes HC5 and HC6 which are formed in the insulating layer LB for each of the pixel circuits 110. Thus, as understood from FIGS. 6, 7 to 9, the power source wiring 41 is conducted to the active region 10A formed in the region constituting the capacitive element C, through the upper capacitive electrode layer CA2 and conduction holes HA3 and HA4 which penetrate the insulating film L0 and the insulating layer LA. As understood from FIGS. 6, 8, and 9, the power source wiring 41 is conducted to the upper capacitive electrode layer CA2 through a conduction hole HC7 which is formed in the insulating layer LB for each of the pixel circuits 110. Thus, as understood from FIGS. 6, 7 to 9, the power source wiring 41 is conducted to the active region 10A which forms the source region or the drain region of the drive transistor Tdr, through the upper capacitive electrode layer CA2 and a conduction hole HC7 which penetrates the insulating film L0 and the insulating layer LA. That is, the upper capacitive electrode layer CA2 also functions as a wiring layer of connecting the source region or the drain region of the drive transistor Tdr with the power source wiring 41. As understood from FIGS. 8 and 9, the power source wiring 41 is conducted to the upper capacitive electrode layer CA4 through conduction holes HC4 and HC8 which are formed in the insulating layer LB for each of the pixel circuits 110.

As understood from FIGS. 8 and 9, the scanning line 22 is conducted to the relay electrode QB2 through a conduction hole HC2 formed in the insulating layer LB for each of the pixel circuits 110. Thus, as understood from FIGS. 7 to 9, the scanning line 22 is conducted to the gate layer Gwr of the writing control transistor Twr through the relay electrode QB2 and a conduction hole HB1 which penetrates the insulating layer LA. As understood from FIG. 9, the scanning line 22 is linearly extended in the row direction (X direction) over the plurality of pixel circuits 110, and is electrically insulated from the upper capacitive electrode layer CA2 and the relay electrode QB4 by the insulating layer LB.

As understood from FIGS. 8 and 9, the control line 27 as the fifth conductive layer is conducted to the relay electrode QB5 through a conduction hole HC10 formed in the insulating layer LB for each of the pixel circuits 110. Thus, as understood from FIGS. 7 to 9, the control line 27 is conducted to the gate layer Gcmp of the compensation transistor Tcmp through the relay electrode QB5 and a conduction hole HB3 which penetrates the insulating layer LA. As understood from FIG. 9, the control line 27 is linearly extended in the row direction (X direction) over the pixel circuit 110, and is electrically insulated from the upper capacitive electrode layer CA2 and the relay electrode QB4 by the insulating layer LB.

As understood from FIGS. 8 and 9, the control line 28 as the fifth conductive layer is conducted to the relay electrode QB7 through a conduction hole HC12 formed in the insulating layer LB for each of the pixel circuits 110. Thus, as understood from FIGS. 7 to 9, the control line 28 is conducted to the gate layer Gel of the light-emitting control transistor Tel through the relay electrode QB7 and a conduction hole HB4 which penetrates the insulating layer LA. As understood from FIG. 9, the control line 28 is linearly extended in the row direction (X direction) over the plurality of pixel circuits 110, and is electrically insulated from the upper capacitive electrode layer CA2 and the relay electrode QB4 by the insulating layer LB.

As understood from FIG. 9, the relay electrode QC3 is conducted to the relay electrode QB6 through a conduction hole HC11 which penetrates the insulating layer LB for each of the pixel circuits 110. Thus, as understood from FIGS. 7 to 9, the relay electrode QC3 is conducted to the active region 10A of the light-emitting control transistor Tel through the relay electrode QB6 and a conduction hole HA9 which penetrates the insulating film L0 and the insulating layer LA.

As understood from FIG. 9, the relay electrode QC1 is conducted to the relay electrode QB3 through a conduction hole HC1 which penetrates the insulating layer LB for each of the pixel circuits 110. Thus, as understood from FIGS. 7 to 9, the relay electrode QC1 is conducted to the active region 10A which forms the drain region or the source region of the writing control transistor Twr, through the relay electrode QB3 and the conduction hole HA1 which penetrates the insulating film L0 and the insulating layer LA. Similarly, the relay electrode QC1 is conducted to the active region 10A which forms the drain region or the source region of the compensation transistor Tcmp, through the relay electrode QB3 and the conduction hole HA1 which penetrates the insulating film L0 and the insulating layer LA.

An insulating layer LC is formed on the surface of the insulating layer LB in which the power source wiring 41, the scanning line 22, the control line 27, the control line 28, and the relay electrodes QC1 and QC3 are formed. As understood from FIGS. 5, 6, and 10, the data transfer line 26 and relay electrodes QD1, QD2, and QD3 as the fifth conductive layer are formed on the surface of the insulating layer LC. The data transfer line 26 is linearly extended in the column direction (Y direction) over the plurality of pixel circuits 110, and is electrically insulated from the scanning line 22, the control line 27, the control line 28, and the power source wiring 41 by the insulating layer LC. Specifically, as understood from FIGS. 9 and 10, the data transfer line 26 is conducted to the relay electrode QC1 through a conduction hole HD1 formed in the insulating layer LC for each of the pixel circuits 110. Thus, as understood from FIGS. 7 to 10, the data transfer line 26 is conducted to the active region 10A through the relay electrode QC1, the conduction hole HC1 which penetrates the insulating layer LB, the relay electrode QB3, and the conduction hole HA1 which penetrates the insulating film L0 and the insulating layer LA. This active region 10A is an active region 10A in which the writing control transistor Twr and the compensation transistor Tcmp are linked to each other. The data transfer line 26 is formed so as to pass through a position of an upper layer of the relay electrode QC1, the scanning line 22, the control line 27, the control line 28, and the power source wiring 41. Thus, the data transfer line 26 is extended along a direction (column direction (Y direction)) of a channel length of the writing control transistor Twr, and overlaps the writing control transistor Twr through the scanning line 22, the control line 27, the control line 28, and the power source wiring 41 in a plan view.

Figure 10:
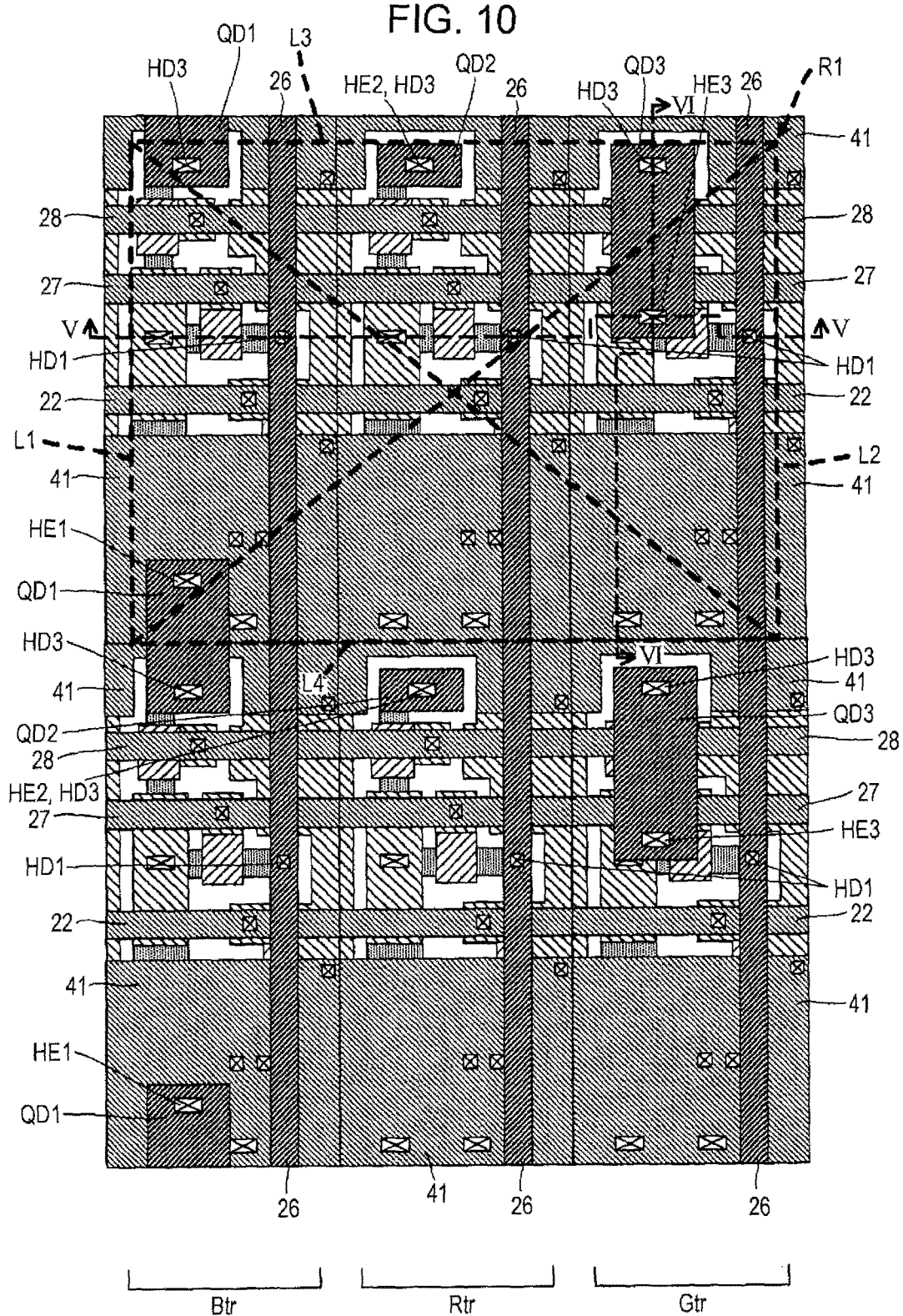
FIG. 10 is a diagram illustrating components formed on the substrate.

As understood from FIGS. 5, 6, and 10, the relay electrode QD1 is conducted to the relay electrode QC3 in a subpixel of a display color of B (blue), through a conduction hole HD3 which penetrates the insulating layer LC. Thus, the relay electrode QD1 is conducted to the active region 10A which forms the drain region or the source region of the light-emitting control transistor Tel in the subpixel of a display color of B (blue), through the conduction hole HD3, the relay electrode QC3, the conduction hole HC11, the relay electrode QB6, and the conduction hole HA9.

As understood from FIGS. 5, 6, and 10, the relay electrode QD2 is conducted to the relay electrode QC3 in a subpixel of a display color of R (red), through the conduction hole HD3 which penetrates the insulating layer LC. Thus, the relay electrode QD2 is conducted to the active region 10A which forms the drain region or the source region of the light-emitting control transistor Tel in the subpixel of a display color of R (red), through the conduction hole HD3, the relay electrode QC3, the conduction hole HC11, the relay electrode QB6, and the conduction hole HA9.

As understood from FIGS. 5, 6, and 10, the relay electrode QD3 is conducted to the relay electrode QC3 in a subpixel of a display color of G (green), through the conduction hole HD3 which penetrates the insulating layer LC. Thus, the relay electrode QD3 is conducted to the active region 10A which forms the drain region or the source region of the light-emitting control transistor Tel in the subpixel of a display color of G (green), through the conduction hole HD3, the relay electrode QC3, the conduction hole HC11, the relay electrode QB6, and the conduction hole HA9.

An insulating layer LD is formed on the surface of the insulating layer LC in which the data transfer line 26 and the plurality of relay electrodes QD (QD1, QD2, and QD3) are formed. As understood from FIGS. 5, 6, and 11, reflective layers 43R, 43G, and 43B as the third conductive layer are formed on the surface of the insulating layer LD. The reflective layer 43R is a reflective layer in a subpixel of a display color of R (red). The reflective layer 43G is a reflective layer in a subpixel of a display color of G (green). The reflective layer 43B is a reflective layer in a subpixel of a display color of B (blue). As understood from FIG. 11, the reflective layer 43B is disposed along the row direction (X direction), so as to overlap the drive transistor Tdr of a subpixel of each of the colors in a plan view. Thus, the reflective layer 43B is disposed along the row direction (X direction), so as to overlap three drive transistors Tdr which constitute one pixel unit of a color image to be displayed, that is, to overlap the drive transistor Tdr in a subpixel of B (blue), the drive transistor Tdr in a subpixel of R (red), and the drive transistor Tdr in a subpixel of G (green) in a plan view.

The reflective layer 43R is conducted to the relay electrode QD2 through a conduction hole HE2 which penetrates the insulating layer LD. That is, the reflective layer 43R is conducted to the active region 10A which forms the drain region or the source region of the light-emitting control transistor Tel in a subpixel of R (red), through the conduction hole HE2, the relay electrode QD2, the conduction hole HD3, the relay electrode QC3, the conduction hole HC11, the relay electrode QB6, and the conduction hole HA9.

The reflective layer 43G is conducted to the relay electrode QD3 through a conduction hole HE3 which penetrates the insulating layer LD. That is, the reflective layer 43G is conducted to the active region 10A which forms the drain region or the source region of the light-emitting control transistor Tel in a subpixel of G (green), through the conduction hole HE3, the relay electrode QD3, the conduction hole HD3, the relay electrode QC3, the conduction hole HC11, the relay electrode QB6, and the conduction hole HA9.

The reflective layer 43B is conducted to the relay electrode QD1 through a conduction hole HE1 which penetrates the insulating layer LD. That is, the reflective layer 43B is conducted to the active region 10A which forms the drain region or the source region of the light-emitting control transistor Tel in a subpixel of B (blue), through the conduction hole HE1, the relay electrode QD1, the conduction hole HD3, the relay electrode QC3, the conduction hole HC11, the relay electrode QB6, and the conduction hole HA9.

Figure 11:
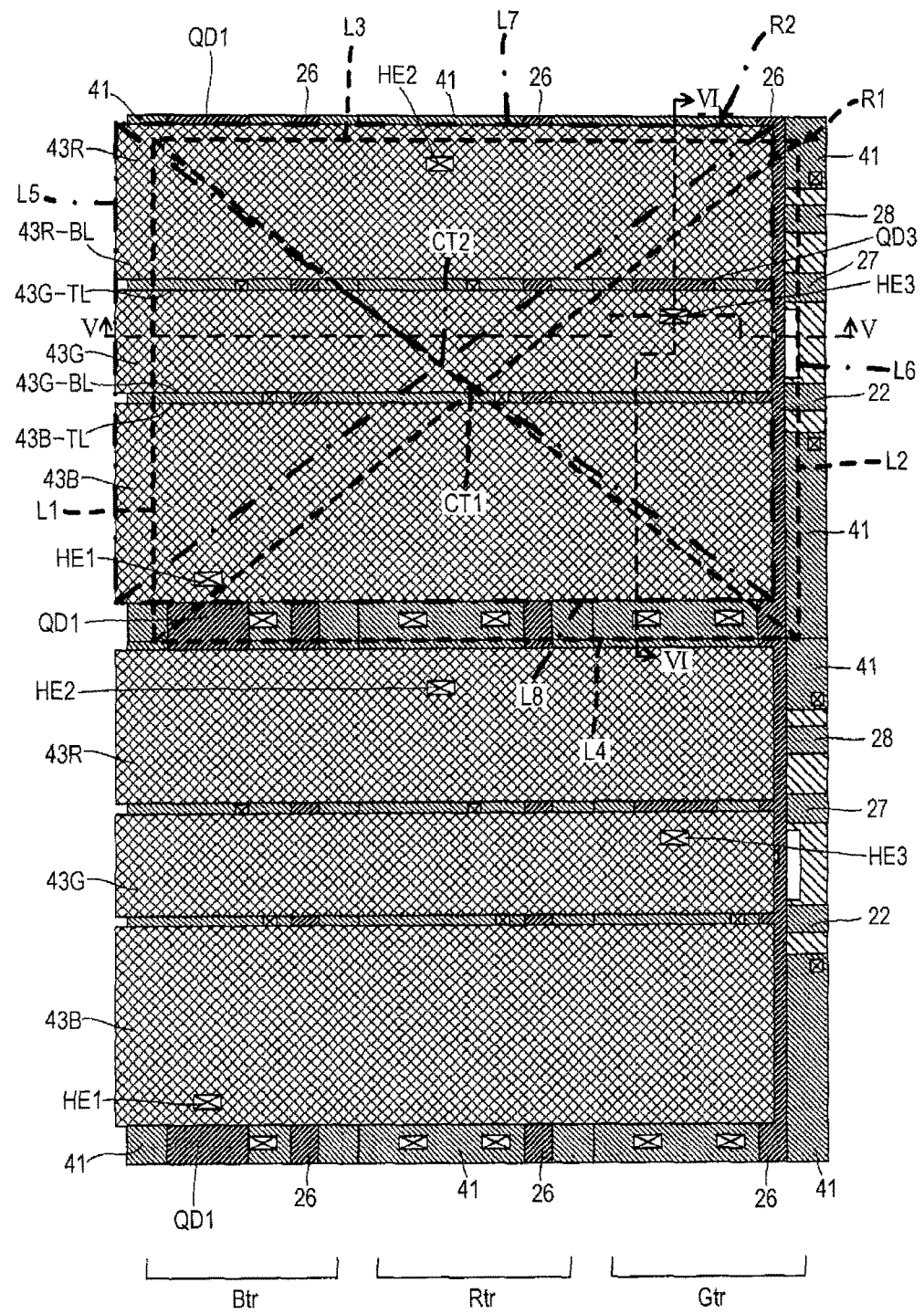
FIG. 11 is a diagram illustrating components formed on the substrate.

As illustrated in FIG. 11, in a plan view, the reflective layers are provided in an order of the reflective layers 43R, 43G, and 43B, and a plurality of transistors in subpixels of the colors which overlap the reflective layers 43R, 43G, and 43B are used as a plurality of transistors in a pixel of one pixel unit. Thus, the reflective layer 43B is conducted to the active region 10A which forms the drain region or the source region of the light-emitting control transistor Tel in a subpixel of B (blue) in a pixel of one pixel unit after one pixel, in the column direction (Y direction).

The reflective layers 43R, 43G, and 43B are formed by, for example, a photoreflective conductive material containing silver or aluminium, and are formed so as to have a film thickness of about 100 nm, for example. As illustrated in FIG. 11, the reflective layers 43R, 43G, and 43B are respectively disposed so as to overlap the transistors in subpixels of the colors in a plan view. Thus, there are advantages in that it is possible to prevent entering of light from the outside by the reflective layers 43R, 43G, and 43B, and to prevent current leakage of each of the transistor occurring by irradiation with light.

In the exemplary embodiment, the plurality of transistors in subpixels of the colors are disposed along the column direction (Y direction). However, the reflective layers 43R, 43G, and 43B in the subpixels of the colors are disposed along the row direction (X direction). Thus, it is possible to commonly use the scanning lines 22 in the writing control transistors Twr in subpixel of the colors, and to form the display region of the subpixel of the colors so as to have a rectangular form in the row direction (X direction).

A rectangular region indicated by one dot chain line in FIG. 11 represents a disposition region R2 of the reflective layers 43R, 43G, and 43B as the third conductive layer in one pixel unit. In the exemplary embodiment, a virtual line which passes through sides of the reflective layers 43R, 43G, and 43B, and passes through sides of the reflective layers 43R, 43G, and 43B positioned at an end of one direction side (left side in FIG. 11) in the row direction (X direction) is defined to be a fifth virtual line L5. A virtual line which passes through sides of the reflective layers 43R, 43G, and 43B positioned at an end of another direction side (right side in FIG. 11) in the row direction (X direction) is defined to be a sixth virtual line L6.

In the exemplary embodiment, a virtual line which passes through sides of the reflective layers 43R, 43G, and 43B positioned at an end of one direction side (upper side in FIG. 11) in the column direction (Y direction) is defined to be a seventh virtual line L7. A virtual line which passes through sides of the reflective layers 43R, 43G, and 43B positioned at an end of another direction side (lower side in FIG. 7) in the column direction (Y direction) is defined to be an eighth virtual line L8.

In the exemplary embodiment, the disposition region R2 of the reflective layers 43R, 43G, and 43B in one pixel unit is defined as a region surrounded by these virtual lines, that is, the fifth virtual line L5, the sixth virtual line L6, the seventh virtual line L7, and the eighth virtual line L8.

An insulating layer LE is formed on the surface of the insulating layer LD in which the reflective layers 43R, 43G, and 43B are formed. As illustrated in FIG. 5, a relay electrode QE1 is formed on the surface of the insulating layer LE.

The relay electrode QE1 is conducted to the reflective layers 43R, 43G, and 43B through a conduction hole HF1 which penetrates the insulating layer LE. The relay electrode QE1 is one of relay electrodes constituting the pixel electrode conduction portion. As understood from FIGS. 5 to 11, the relay electrode QE1 is conducted to the active region 10A which forms the drain region or the source region of the light-emitting control transistor Tel, through the reflective layers 43R, 43G, and 43B, the plurality of relay electrodes, and a plurality of conduction holes.

As understood from FIGS. 5 and 6, an optical path adjusting layer 60 is formed on the surface of the insulating layer LE in which the relay electrode QE1 is formed. The optical path adjusting layer 60 is a light-transmissive film member for defining a resonant wavelength (that is, display color) of a resonant structure of each of the pixel circuits 110. Setting is performed as follows. In pixels of which display colors are the same as each other, resonant wavelengths of resonant structures are the same as each other. In pixels of which display colors are different from each other, resonant wavelengths of resonant structures are different from each other. In the exemplary embodiment, as illustrated in FIG. 6, the optical path adjusting layer 60 is formed by two layers, in a subpixel of a display color of R (red). In a subpixel of a display color of G (green), the optical path adjusting layer 60 is formed by one layer. In a subpixel of a display color of B (blue), the optical path adjusting layer 60 is not formed.

As illustrated in FIGS. 5 and 6, the first electrode El for each subpixel of each of the colors is formed on the surface of the optical path adjusting layer 60. The first electrode E1 is formed of, for example, a light-transmissive conductive material such as indium tin oxide (ITO). As described above with reference to FIGS. 3 and 4, the first electrode E1 is an electrode (pixel electrode) which has a substantially rectangular shape and functions as an anode of the light emitting element 45. As understood from FIGS. 5 and 6, the first electrode E1 is conducted to the relay electrode QE1 through a conduction hole HG1 formed in the optical path adjusting layer 60. Thus, as understood from FIGS. 5 and 6, the first electrode E1 is conducted to the active region 10A which forms the drain region or the source region of the light-emitting control transistor Tel, through the optical path adjusting layer 60, the reflective layers 43R, 43G, and 43B, the plurality of relay electrodes, and the plurality of conduction holes.

As illustrated in FIGS. 5 and 6, a pixel definition layer 65 is formed on the surface of the optical path adjusting layer 60 in which the first electrode E1 is formed, over the entire region of the substrate 10. The pixel definition layer 65 is formed of, for example, an insulating inorganic material such as a silicon compound (typically, silicon nitride or silicon oxide). The pixel definition layer 65 causes an opening corresponding to the first electrode E1 in a subpixel of each display color to be formed.

Regarding the size of the opening, the size of an opening in a subpixel of B (blue) is largest, and the size of an opening in a subpixel of G (green) is next largest. The size of an opening in a subpixel of R (red) is smallest. The sizes of openings in two subpixels having a display color different from each other may be set to be equal to each other, and an opening in the remaining one subpixel may be set to be largest. The sizes of openings in subpixels of the colors may be equal to each other.

The openings are arranged at a common pitch in the column direction (Y direction), in an order of subpixels of B (blue), G (green), and R (red). Openings in subpixels of the same color are arranged at a common pitch along the row direction (X direction).

As illustrated in FIGS. 5 and 6, the light-emitting function layer 46, the second electrode E2, and a sealing member 47 are stacked on an upper layer of the first electrode E1. A sealing substrate (not illustrated) is bonded to the surface of the substrate 10 in which the above-described elements are formed, by using an adhesive. The sealing substrate is a plate-like member (for example, glass substrate) which is light-transmissive and is used for protecting the elements on the substrate 10. A color filter is formed on the surface of the sealing substrate or the surface of the sealing member 47, for each pixel circuit of a subpixel. As the color filter, a color filter CFB of B (blue), a color filter CFG of G (green), and a color filter CFR of R (red) are used.

As described above, in the exemplary embodiment, the plurality of transistors in subpixels of the colors is disposed in a pixel circuit region of which the width in the row direction (X direction) is narrower than the width in the column direction (Y direction). Thus, the scanning lines 22 can be commonly used in the writing control transistor Twr in subpixels of the colors, and the number of scanning lines 22 selected in one horizontal scanning period is not increased. As a result, it is possible to prevent reducing of a selection time of each of the scanning lines 22 in one horizontal scanning period, and to reliably write data from the data transfer line 26 to the first electrode E1.

In the exemplary embodiment, as illustrated in FIG. 11, the center position CT1 of the disposition region R1 of the plurality of transistors in one pixel unit is different from the center position CT2 of the disposition region R2 of the reflective layers 43R, 43G, and 43B in the one pixel unit.

The sizes of the reflective layers 43R, 43G, and 43B are determined by the sizes of the openings which are defined by the pixel definition layer 65. Thus, the sizes of the reflective layers 43R, 43G, and 43B are limited. In order to reliably prevent irradiation of the transistor with light from the light-emitting function layer 46 by using the reflective layers 43R, 43G, and 43B which have such limited sizes, it is necessary that positions of the reflective layers 43R, 43G, and 43B are appropriately moved.

Thus, in the exemplary embodiment, the center position CT1 of the disposition region R1 of the plurality of transistors is different from the center position CT2 of the disposition region R2 of the reflective layers 43R, 43G, and 43B, and thus the reflective layers 43R, 43G, and 43B cause irradiation of the transistor with light from the light-emitting function layer 46 to be reliably prevented. That is, the reflective layers 43R, 43G, and 43B in subpixels of the colors are disposed along the row direction (X direction), so as to overlap the transistors in subpixels of the colors. Accordingly, it is possible to prevent irradiation of the transistor with light from the light-emitting function layer 46, and the characteristics of the transistor are not changed.

In particular, the reflective layer 43B in a subpixel of blue having the largest area is disposed so as to overlap the drive transistor Tdr in subpixels of the colors. Thus, irradiation of the drive transistor Tdr with light from the light-emitting function layer 46, which influences elaborated gradation display is reliably prevented, and changing characteristics of the drive transistor Tdr is prevented. Thus, accurate gradation display is possible.

In the exemplary embodiment, the power source wiring 41 which is extended in the row direction (X direction) so as to overlap transistors is provided between the reflective layers 43R, 43G, and 43B, and the transistors which overlap the reflective layers 43R, 43G, and 43B, in a plan view. Thus, it is possible to block light from the light-emitting function layer 46 by the power source wiring 41 having an area which is relatively larger than that of other wirings, in addition to the reflective layer 43B, and to prevent irradiation of the drive transistor Tdr further more reliably. Accordingly, irradiation of the drive transistor Tdr with light from the light-emitting function layer 46, which influences elaborated gradation display is further more reliably prevented, and changing characteristics of the drive transistor Tdr is prevented. Thus, accurate gradation display is possible.

In the exemplary embodiment, the seventh virtual line L7 and the eighth virtual line L8 which define the disposition region R2 of the reflective layers 43R, 43G, and 43B are positioned over the power source wiring 41 in a plan view. Thus, in a plan view, there is no gap between the reflective layer 43R and the power source wiring 41, and is no gap between the reflective layer 43B and the power source wiring 41. Accordingly, it is possible to prevent irradiation of the transistor with light from the light-emitting function layer 46 further more reliably. In the exemplary embodiment, both of the reflective layer 43R and the reflective layer 43B overlap the power source wiring 41 in a plan view. Thus, both of the seventh virtual line L7 and the eighth virtual line L8 are positioned on the power source wiring 41. However, the embodiment is not limited to such a configuration, and either of the seventh virtual line L7 and the eighth virtual line L8 may be positioned on the power source wiring 41 in accordance with a form of disposition of the power source wiring 41.

In the exemplary embodiment, as illustrated in FIG. 11, a side 43R-BL on another side (lower side in FIG. 11) in the column direction (Y direction) among sides of the reflective layer 43R, and a side 43G-TL on one side (upper side in FIG. 11) in the column direction (Y direction) among sides of the reflective layer 43G face each other in the column direction (Y direction). The side 43R-BL and the side 43G-TL are positioned on the control line 27 in a plan view.

Similarly, as illustrated in FIG. 11, a side 43G-BL on another side (lower side in FIG. 11) in the column direction (Y direction) among the sides of the reflective layer 43G, and a side 43B-TL on one side (upper side in FIG. 11) in the column direction (Y direction) among sides of the reflective layer 43B face each other in the column direction (Y direction). The side 43G-BL and the side 43B-TL are positioned on the scanning line 22 in a plan view.

As described above, in the exemplary embodiment, the sides 43R-BL, 43G-TL, 43G-BL, and 43B-TL of the reflective layers 43R, 43G, and 43B, which face each other in the column direction (Y direction) are positioned on the control line 27 and the scanning line 22 in a plan view. Thus, in a plan view, there is no gap between the reflective layer 43R and the reflective layer 43G, and the control line 27, and there is no gap between the reflective layer 43G and the reflective layer 43B, and the scanning line 22. Accordingly, it is possible to prevent irradiation of the transistor with light from the light-emitting function layer 46 further more reliably.

In the exemplary embodiment, sides of the reflective layers 43R, 43G, and 43B, which face each other in the column direction are positioned on the control line 27 and the scanning line 22 in a plan view. However, the embodiment is not limited to such a configuration, and sides which face each other in the column direction in at least two reflective layers which are adjacent in the column direction may be positioned on the control line or the scanning line 22 in a plan view. The control line may be the control line 28 in addition to the control line 27.

In the exemplary embodiment, the second virtual line L2 which defines the disposition region R2 of the reflective layers 43R, 43G, and 43B is positioned on the data transfer line 26 in a plan view. Thus, in a plan view, there is no gap between the reflective layers 43R, 43G, and 43B, and the data transfer line 26. Accordingly, it is possible to prevent irradiation of the transistor with light from the light-emitting function layer 46 further more reliably. In a plan view, the first virtual line L1 which defines the disposition region R2 of the reflective layers 43R, 43G, and 43B may be positioned on the data transfer line 26, or both of the second virtual line L2 and the first virtual line L1 may be positioned on the data transfer line 26.

In the exemplary embodiment, the plurality of transistors in subpixels of the colors are disposed along the column direction (Y direction), and the reflective layers 43B, 43G, and 43R in the subpixels of the colors are disposed along the row direction (X direction). Thus, even in a case where a direction to which the main light line of the electro-optical device 1 is largely inclined is designed so as to be set as the row direction (X direction), it is possible to arrange subpixels of the same color in the row direction (X direction) of the display surface, without an increase of the number of scanning lines 22. As a result, the electro-optical device 1 in which color shift hardly occurs regarding the row direction (X direction) even though the display surface is observed at an inclined angle is provided.

In the above-described exemplary embodiment, as understood from FIG. 11, regarding the area of the reflective layer, the area of the reflective layer 43B is largest, and the area of the reflective layer 43G is next largest. The area of the reflective layer 43R is smallest.

Figure 12:
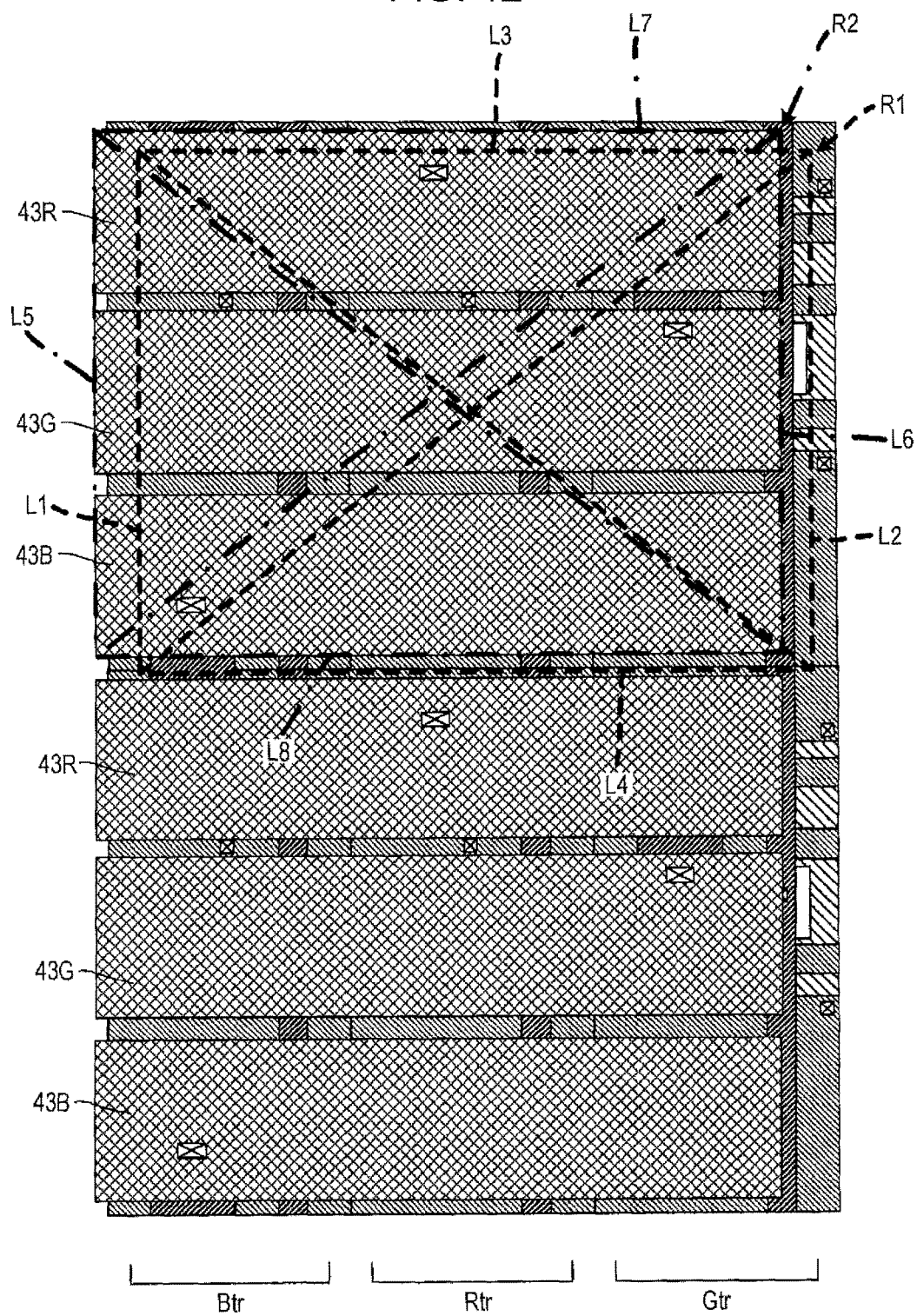
FIG. 12 is a diagram illustrating components formed on the substrate.

However, the embodiment is not limited to such a configuration, for example, as illustrated in FIG. 12, the areas of the reflective layer 43B, the reflective layer 43G, and the reflective layer 43R may be set to be equal to each other. In the example illustrated in FIG. 12, with such a configuration, the entirety of the reflective layer 43B overlaps the power source wiring 41 in a plan view.

In FIG. 12, a side of the reflective layer 43B on one direction side (left side) in the row direction (X direction) seems to be separate from a side of the power source wiring 41 on the one direction side (left side) in the row direction (X direction). However, as described above, the power source wiring 41 is formed so as to continue over a plurality of one pixel units in the row direction (X direction). Thus, in practice, the entirety of the reflective layer 43B overlaps the power source wiring 41 in a plan view.

In this manner, the entirety of the reflective layer 43B overlaps the power source wiring 41 in a plan view, and thus there is no gap between the reflective layer 43B and the power source wiring 41 in a plan view. Accordingly, it is possible to further more reliably prevent irradiation of the transistor with light from the light-emitting function layer 46 by the reflective layer 43B and the power source wiring 41.

In a plan view, at least one reflective layer of which the entirety overlaps the power source wiring 41 may be provided, or the entirety of a reflective layer other than the reflective layer 43B may overlap the power source wiring 41. Accordingly, the entirety of all of the reflective layers 43R, 43G, and 43B may be set to overlap the power source wiring 41 in a plan view.

Second Exemplary Embodiment

Figure 13:
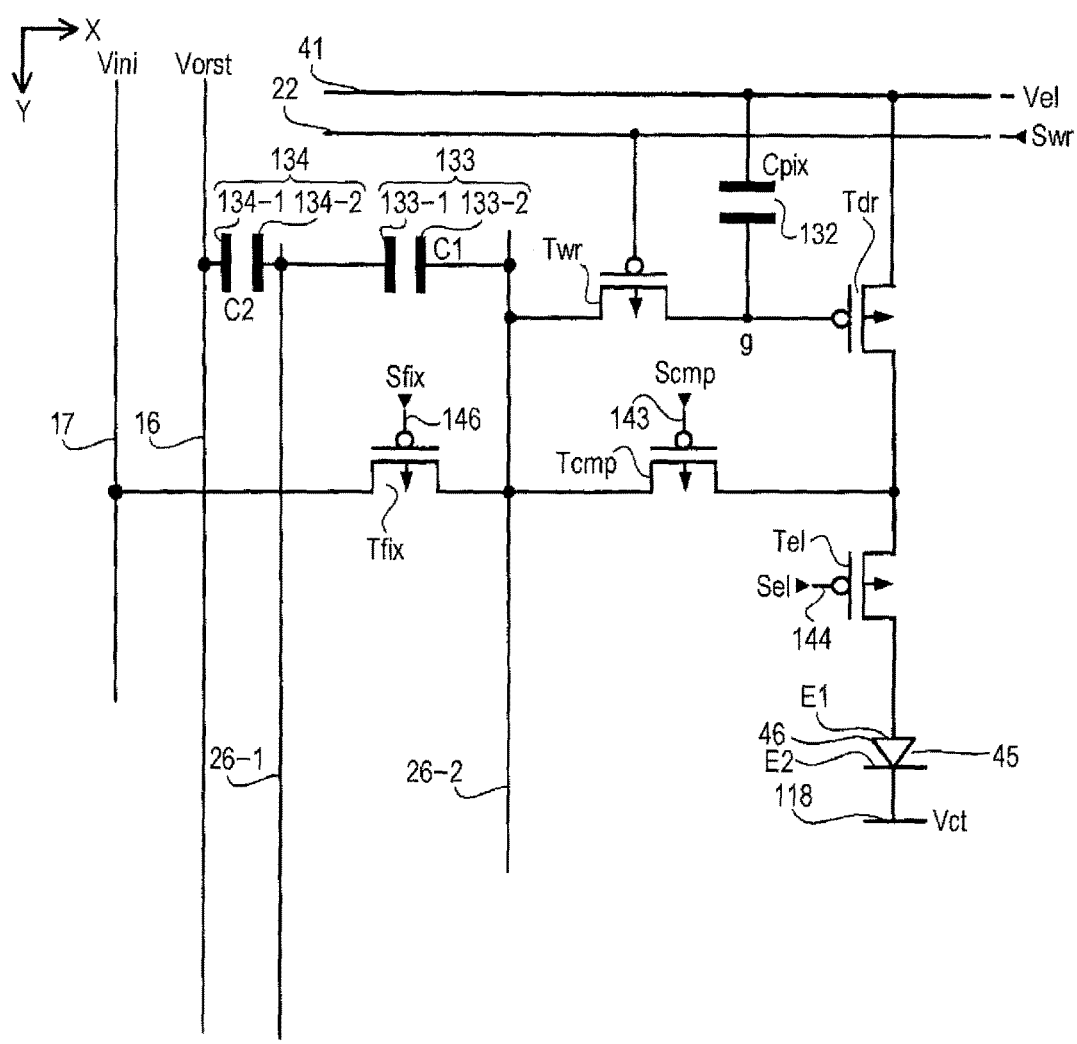
FIG. 13 is a circuit diagram illustrating a configuration of a pixel circuit according to a second exemplary embodiment.

Next, a second exemplary embodiment will be described with reference to FIGS. 13 to 22. FIG. 13 is a circuit diagram corresponding to FIG. 3 or 4 in the first exemplary embodiment.

A configuration in which the pixel circuit 110 includes four transistors is described in the first exemplary embodiment. However, in this exemplary embodiment, the pixel circuit 110 includes five transistors. In this exemplary embodiment, the data transfer line includes a first data transfer line and a second data transfer line.

The pixel circuit 110 in this exemplary embodiment will be described with reference to FIG. 13. As illustrated in FIG. 13, a first electrode 133-1 of a transfer capacitance 133 and a second electrode 134-2 of a shield capacitance 134 are electrically connected to a first data transfer line 26-1.

The second electrode 133-2 of the transfer capacitance 133, and the source or the drain of an initialization transistor Tfix are electrically connected to a second data transfer line 26-2.

A grayscale potential depending on the designated grayscale is supplied to the pixel circuit 110 through the first data transfer line 26-1 and the second data transfer line 26-2.

In this exemplary embodiment, one second data transfer line 26-2 is used in one subpixel. However, the embodiment is not limited to such a configuration, one second data transfer line 26-2 may be shared in a plurality of subpixels. In this case, the plurality of subpixels may be set to share one second data transfer line 26-2, one transfer capacitance 133, and the initialization transistor Tfix.

A power feeding line 17 to which an initial potential Vini is supplied is connected to the drain or the source of the initialization transistor Tfix. A voltage Vref for initializing the first data transfer line 26-1 is supplied to the first data transfer line 26-1. The voltage Vref may be equal to the initial potential Vini.

The writing control transistor Twr is electrically connected to the scanning line 22, and one of the source and the drain thereof is electrically connected to the second data transfer line 26-2. Another of the source and the drain of the writing control transistor Twr is electrically connected to the gate of the drive transistor Tdr and one electrode of the pixel capacitance 132. That is, the writing control transistor Twr is electrically connected to a node between the gate of the drive transistor Tdr and the second electrode 133-2 of the transfer capacitance 133. The writing control transistor Twr functions as a transistor for controlling electrical connection between the gate of the drive transistor Tdr, and the second electrode 133-2 of the transfer capacitance 133 connected to the second data transfer line 26-2.

The source of the drive transistor Tdr is electrically connected to the power source wiring 41, and the drain thereof is electrically connected to one of the source and the drain of the compensation transistor Tcmp, and to the source of the light-emitting control transistor Tel.

Here, a potential Vel which corresponds to a high potential side of the power source in the pixel circuit 110 is fed to the power source wiring 41. This drive transistor Tdr functions as a drive transistor for causing a current depending on a voltage between the gate and the source of the drive transistor Tdr to flow.

The gate of the compensation transistor Tcmp is electrically connected to a control line 143, and a control signal Scmp is supplied to the gate thereof. This compensation transistor Tcmp functions as a switching transistor for controlling an electrical connection between the gate and the drain of the drive transistor Tdr. Thus, the compensation transistor Tcmp is a transistor for conducting the gate and the drain of the drive transistor Tdr through the writing control transistor Twr. The writing control transistor Twr is connected to a node between one of the source and the drain of the compensation transistor Tcmp, and the gate of the drive transistor Tdr. However, it may be analyzed that the one of the source and the drain of the compensation transistor Tcmp is electrically connected to the gate of the drive transistor Tdr.

The gate of the light-emitting control transistor Tel is electrically connected to a control line 144, and a control signal Sel is supplied to the gate thereof. The source or the drain of the light-emitting control transistor Tel is electrically connected to the sources or the drains of the drive transistor Tdr and the compensation transistor Tcmp. Further, the source or the drain of the light-emitting control transistor Tel is electrically connected to the first electrode El of the light emitting element 45. This light-emitting control transistor Tel functions as a switching transistor for controlling an electrical connection between the source or the drain of the drive transistor Tdr, and the first electrode El of the light emitting element 45. In this exemplary embodiment, an OLED is also used as the light emitting element 45.

The gate of the initialization transistor Tfix is electrically connected to a control line 146, and a control signal Sfix is supplied to the gate thereof. One of the source and the drain of the initialization transistor Tfix is electrically connected to the second data transfer line 26-2, and is electrically connected to the second electrode 133-2 of the transfer capacitance 133 and another of the source and the drain of the writing control transistor Twr through the second data transfer line 26-2. Another of the source and the drain of the initialization transistor Tfix is electrically connected to the power feeding line 17.

This initialization transistor Tfix mainly functions as a switching transistor for controlling an electrical connection between the second data transfer line 26-2 and the power feeding line 17. In this exemplary embodiment, the second data transfer line 26-2 on the transfer capacitance 133 side of the writing control transistor Twr, which functions as a floating node during a light emitting period is set to an initial potential Vini which is a fixed potential in a period when other pixel circuits perform processing for an initialization period. The initialization transistor Tfix is in the ON state during the light emitting period, and conducts the second data transfer line 26-2 and the power feeding line 17. As a result, the potential of the second data transfer line 26-2 is set to the initial potential Vini.

In the exemplary embodiment, the display panel 2 is formed by a silicon substrate. Thus, a substrate potential of each transistor is set to the potential Vel. The source and the drain of each transistor may be replaced with each other in accordance with a channel type of the transistor and a relationship of the potential. The transistor may be a thin film transistor or be a field effect transistor.

The pixel capacitance 132 has one electrode which is electrically connected to the gate g of the drive transistor Tdr, and another electrode which is electrically connected to the power source wiring 41. Thus, the pixel capacitance 132 functions as a holding capacitance for holding a voltage between the gate and the source of the drive transistor Tdr. A capacitance value of the pixel capacitance 132 is described as Cpix.

A parasitic capacitance at the gate g of the drive transistor Tdr may be used as the pixel capacitance 132, or a capacitance formed in such a manner that an insulating layer is interposed between conductive layers which are different from each other, in the silicon substrate may be used.

The first electrode 133-1 of the transfer capacitance 133 is electrically connected to one electrode of the holding capacitance (not illustrated) through the first data transfer line 26-1. The second electrode 133-2 of the transfer capacitance 133 is electrically connected to the gate g of the drive transistor Tdr through the second data transfer line 26-2 and the writing control transistor Twr. Thus, the transfer capacitance 133 functions as a transfer capacitance in a compensation period which will be described later. The transfer capacitance performs level shift of the potential of the gate g by a value which is obtained by multiplying a capacitance ratio between the transfer capacitance 133 and the holding capacitance by a changed quantity of the potentials of the first data transfer line 26-1 and the first electrode 133-1. A capacitance value of the transfer capacitance 133 is described as C1.

In the exemplary embodiment, a shield capacitance 134 is provided between the power feeding line 16 and the first data transfer line 26-1. A reset potential Vorst is supplied to the power feeding line 16. The transfer capacitance 133 is an electrostatic capacitance including the first electrode 134-1 and the second electrode 134-2. The shield capacitance 134 functions as a shield capacitance for shielding the first data transfer line 26-1. A capacitance value of the shield capacitance 134 is described as C2.

The first electrode E1 of the light emitting element 45 is a pixel electrode which is separately provided for each pixel circuit 110. On the contrary, the second electrode E2 of the light emitting element 45 is a common electrode 118 which is commonly provided for all of the pixel circuits 110, and is held to have a potential Vct which corresponds to a lower potential side in the pixel circuit 110. The light emitting element 45 is an element in which a white organic EL layer is interposed between the first electrode E1 and a cathode having light transmission, in the silicon substrate. A color filter corresponding to any of RGB overlaps an emission side (cathode side) of the light emitting element 45. An optical distance between two reflective layers between which the white organic EL layer is interposed may be adjusted so as to form a cavity structure, and a wavelength of light emitted from the light emitting element 45 may be set. In this case, the color filter may or may not be provided.

In such a light emitting element 45, if a current flows in the cathode from the first electrode E1, holes injected from the first electrode E1 and electrons injected from the cathode are recombined in the organic EL layer, and thus exitons are generated, and white light is generated. The white light generated at this time is transmitted through the cathode on an opposite side of the silicon substrate (first electrode E1), is colored by the color filter, and thus is visually recognized on an observer side.

Next, an operation of the electro-optical device 1 will be simply described with reference to FIG. 13. In this exemplary embodiment, the horizontal scanning period is roughly separated into an initialization period, a compensation period, a writing period, and a non-light emitting period. The non-light emitting period continues in the next horizontal scanning period. The further next horizontal scanning period is used as the light emitting period, and a period after a period of one frame elapses reaches the first horizontal scanning period again. Thus, in an order of time, a cycle of initialization period→compensation period→writing period→non-light emitting period light emitting period is repeated.

Initialization Period

In an initialization period of the first row, the scanning signal Swr(1) has a H level, the control signal Sel(1) has a H level, the control signal Scmp(1) has a H level, and the control signal Sfix(1) has an L level.

Thus, in the pixel circuit 110 of 1×1, the initialization transistor Tfix turns ON, and the drive transistor Tdr, the writing control transistor Twr, the compensation transistor Tcmp, and the light-emitting control transistor Tel turn OFF. Accordingly, a path of a current supplied to the light emitting element 45 is cut off, and thus the light emitting element 45 is in the OFF (non-light emitting) state.

Here, since the control signal Sfix has an L level in the initialization period, the initialization transistor Tfix is ON. Thus, the second data transfer line 26-2 connected to the second electrode 133-2 of the transfer capacitance 133 is set to have an initial potential Vini. The first electrode 133-1 of the transfer capacitance 133 is also set to have an initial potential Vini by a circuit (not illustrated). Accordingly, the transfer capacitance 133 is initialized.

In the demultiplexer DM, during the initialization period, the control signal Sel(1) has a H level, and the control signal /Sel(1) has an L level. Thus, a grayscale potential is written in a holding capacitance (not illustrated). Compensation Period If the initialization period is ended, the compensation period starts. In a compensation period of the first row, the scanning signal Swr(1) has an L level, the control signal Sel(1) has a H level, the control signal Scmp(1) has an L level, and the control signal Sfix(1) has a H level.

Thus, in the pixel circuit 110, the writing control transistor Twr and the compensation transistor Tcmp turn ON, and the light-emitting control transistor Tel and the initialization transistor Tfix turn OFF. At this time, the gate g of the drive transistor Tdr is connected (diode-connected) to the drain of the drive transistor Tdr itself through the writing control transistor Twr and the compensation transistor Tcmp. A drain current flows in the drive transistor Tdr, and thus the gate g is charged.

That is, the drain and the gate g of the drive transistor Tdr are connected to the second data transfer line 26-2. If the threshold voltage of the drive transistor Tdr is defined to be Vth, the potential Vg at the gate g of the drive transistor Tdr gradually approaches (Vel-Vth).

In the demultiplexer DM, during the compensation period, the control signal Sel(1) has a H level, and the control signal /Sel(1) has an L level. Thus, the grayscale potential is written in the holding capacitance (not illustrated).

The light-emitting control transistor Tel is OFF, and thus the drain of the drive transistor Tdr is not electrically connected to the light emitting element 45. Writing Period If the compensation period is ended, the writing period starts. In a writing period of the first row, the scanning signal Swr(1) has an L level, the control signal Sel(1) has a H level, the control signal Scmp(1) has a H level, and the control signal Sfix(1) has a H level.

Thus, in the pixel circuit 110 of 1×1, the writing control transistor Twr122 turns ON, and the compensation transistor Tcmp, the light-emitting control transistor Tel, and the initialization transistor Tfix turn OFF.

Here, in the writing period, one electrode of the holding capacitance (not illustrated) is connected to the first data transfer line 26-1 and the first electrode 133-1, and the grayscale potential is supplied to the first electrode 133-1. A signal obtained by level-shifting the grayscale potential is supplied to the gate of the drive transistor Tdr, and is written in the pixel capacitance 132.

The light-emitting control transistor Tel is OFF, and thus the drain of the drive transistor Tdr is not electrically connected to the light emitting element 45.

Non-light Emitting Period

The scanning signal Swr(1) rises from an L level to a H level, and if the writing period is ended, the remaining period of one horizontal scanning period (H) and the next one horizontal scanning period (H) corresponds to the non-light emitting period. In the non-light emitting period, all of the transistors turn OFF.

Light Emitting Period

If the non-light emitting period is ended, the light emitting period starts. In a light emitting period of the first row, the scanning signal Swr(1) has a H level, the control signal Sel(1) has an L level, the control signal Scmp(1) has a H level, and the control signal Sfix has a H level.

Thus, in the pixel circuit 110 of 1×1, the light-emitting control transistor Tel turns ON, and the writing control transistor Twr, the compensation transistor Tcmp, and the initialization transistor Tfix turn OFF. Accordingly, the drive transistor Tdr supplies a drive current Ids depending on a voltage which has been held by the pixel capacitance 132, that is, on a gate-source voltage Vgs, to the light emitting element 45. That is, a current depending on a grayscale potential which depends on the designated grayscale of each pixel is supplied to the light emitting element 45 by the drive transistor Tdr, and light is emitted with luminance depending on the current.

Because the light emitting period of the first row is a period when horizontal scanning is performed during a period other than the period of the first row, the potentials of the first data transfer line 26-1 and the second data transfer line 26-2 appropriately fluctuate. In particular, in a case where the initialization transistor Tfix, the writing control transistor Twr, and the compensation transistor Tcmp are OFF, the second data transfer line 26-2 is in a state of floating, and the potential thereof easily fluctuates.

Thus, in this exemplary embodiment, the initialization transistor Tfix is caused to turn ON in other pixel circuits 110, during the light emitting period. Thus, the first data transfer line 26-1 and the second data transfer line 26-2 are in a conduction state, and a period when the initial potential Vini is supplied to the second data transfer line 26-2 is provided.

That is, the second data transfer line 26-2 on the transfer capacitance 133 side of the writing control transistor Twr which is a floating node for the light emitting period is set to have an initial potential Vini which is a fixed potential in a period when processing of the initialization period is performed in other pixel circuits. Thus, it is possible to suppress approaching of the potential of the second data transfer line 26-2 to the power source voltage. As a result, a situation where the writing control transistor Twr is ON does not occur, a voltage is held in the pixel capacitance 132, and inconvenience in display does not occur.

Next, a specific structure of the electro-optical device 1 according to the second exemplary embodiment will be described below in detail, with reference to FIGS. 14 to 22. In the drawings which are used as a reference in the following descriptions, for convenient descriptions, dimensions or scales of components are different from those of a practical electro-optical device 1.

Figure 14:
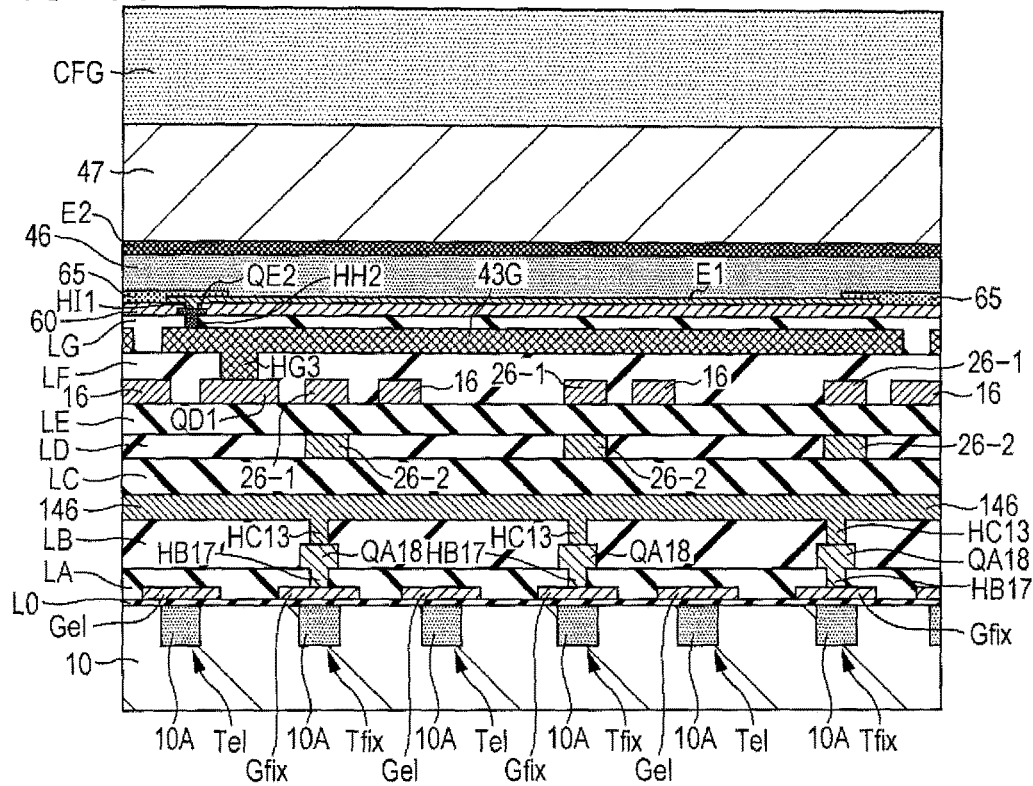
FIG. 14 is a sectional view of a pixel of one pixel unit in the row direction.
Figure 15:
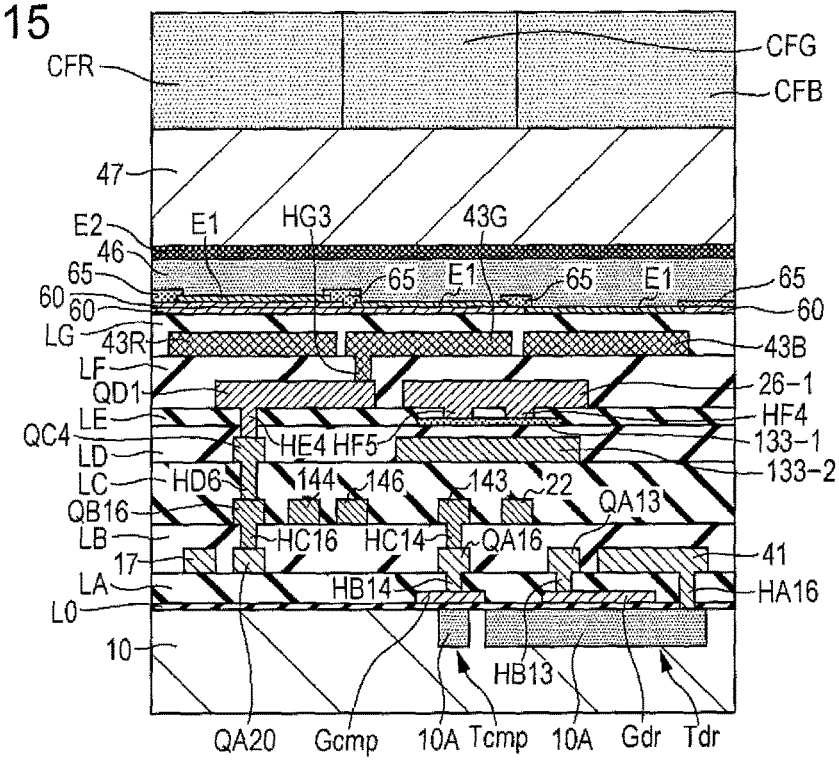
FIG. 15 is a sectional view of a subpixel in the column direction.

FIG. 14 is a sectional view corresponding to a section which includes XIV-XIV line in FIGS. 16 to 22. FIG. 15 is a sectional view corresponding to a section which includes XV-XV line in FIGS. 16 to 22. FIGS. 16 to 22 are plan view illustrating a form of the surface of the substrate 10 at each stage for forming components of the electro-optical device 1, focusing on two pixel circuits 110 in one pixel unit. FIGS. 16 to 22 are plan views. However, from a viewpoint of easily performing visual recognition of the components, hatching having the same shape in FIGS. 14 and 15 is added to components which are common in FIGS. 16 and 22.

Figure 16:
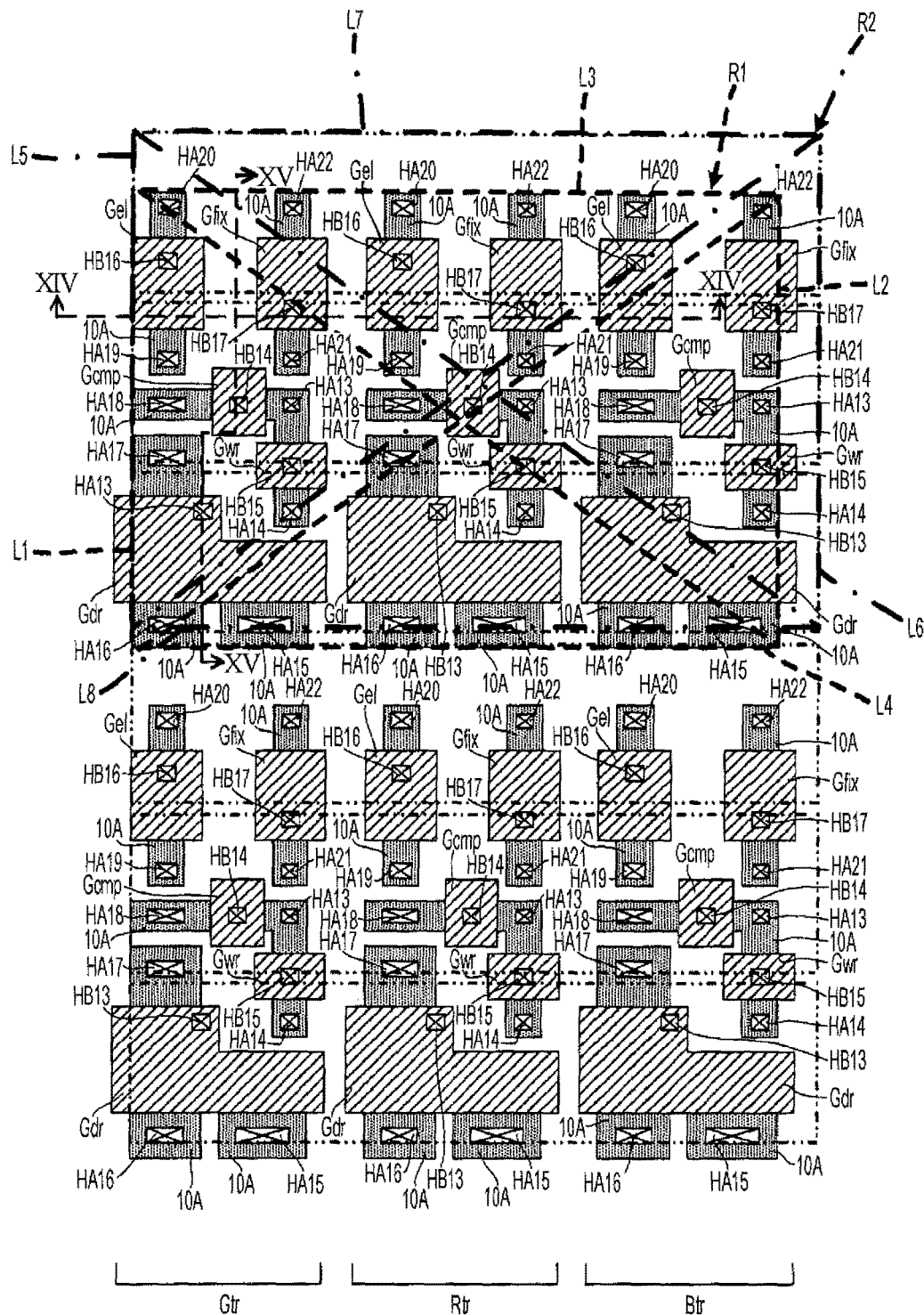
FIG. 16 is a diagram illustrating components formed on a substrate.

As understood from the portion of the active layer in FIGS. 14, 15, and 16, an active region (source/drain region) 10A of each of the transistors Tdr, Twr, Tcmp, Tel, and Tfix in the pixel circuit 110 is formed in the surface of the substrate 10. The substrate 10 is formed of a semiconductor material such as silicon. Ions are injected to the active region 10A. An active layer of each of the transistors Tdr, Twr, Tcmp, Tel, and Tfix in the pixel circuit 110 is provided between the source region and the drain region, and ions of a type different from that in the active region 10A are injected to the active layer. However, for convenience, the active layer is illustrated so as to be integrated with the active region 10A. In this exemplary embodiment, the active region 10A is also formed in a region constituting the pixel capacitance 132, impurities are injected to the active region 10A, and the active region 10A is connected to the power source. Thus, a so-called MOS capacitance in which the active region 10A is used as one electrode, and a capacitive electrode formed with an insulating layer is used as another electrode is configured. The active region 10A in the region constituting the pixel capacitance 132 also functions as the power source potential portion. As understood from the portion of the active layer in FIG. 16, the active region 10A of the compensation transistor Tcmp is joined to the active region 10A of the writing control transistor Twr in a portion at which the conduction hole HA13 is provided. Accordingly, the current end of the compensation transistor Tcmp also functions as a current end of the writing control transistor Twr. As understood from the portion of the gate layer in FIGS. 14 and 15, and from FIG. 16, the surface of the substrate 10 in which the active region 10A is formed is covered with the insulating film (gate insulating film) L0, and gate layers Gdr, Gwr, Gcmp, Gel, and Gfix of the transistors Tdr, Twr, Tcmp, Tel, and Tfix are formed on the surface of the insulating film L0. The gate layers Gdr, Gwr, Gcmp, Gel, and Gfix of the transistors Tdr, Twr, Tcmp, Tel, and Tfix face the active layer with the insulating film L0 interposed between the gate layers and the active layer.

As illustrated at the portion of the gate layer in FIG. 16, the gate layer Gdr of the drive transistor Tdr is formed to be extended to the active region 10A which is formed in the region constituting the capacitive element, and constitutes the pixel capacitance 132.

In this exemplary embodiment, as illustrated in FIG. 16, the plurality of transistors Tdr, Twr, Tel, and Tcmp in subpixels of G (green), R (red), and B (blue) is disposed in the pixel circuit region of which the width in the row direction (X direction) is narrower than the width in the column direction (Y direction). In FIGS. 16 to 22, in each subpixel of B (blue), a plurality of transistors is indicated by Btr. In each subpixel of R (red), a plurality of transistors is indicated by Rtr. In each subpixel of G (green), a plurality of transistors is indicated by Gtr.

A rectangular region indicated by a dot line in FIGS. 16 to 22 represents the disposition region R1 of transistors in one pixel unit. In this exemplary embodiment, a virtual line which passes through a side of the active region 10A of the transistor and passes through a side of the active region 10A of the drive transistor Tdr positioned at an end of one direction side (left side in FIGS. 16 to 22) in the row direction (X direction) is defined to be the first virtual line L1. A virtual line which passes through a side of the active region 10A of the pixel capacitance 132 positioned at an end of another direction side (right side in FIGS. 16 to 22) in the row direction (X direction) is defined to be the second virtual line L2.

In this exemplary embodiment, a virtual line which passes through a side of the active region 10A of the light-emitting control transistor Tel positioned at an end of one direction side (upper side in FIGS. 16 to 22) in the column direction (Y direction) is defined to be the third virtual line L3. A virtual line which passes through a side of the active region 10A of the drive transistor Tdr positioned at an end of another direction side (lower side in FIGS. 16 to 22) in the column direction (Y direction) is defined to be the fourth virtual line L4.

In the exemplary embodiment, the disposition region R1 of transistors in one pixel unit is defined to be a region surrounded by the virtual lines, that is, the first virtual line L1, the second virtual line L2, the third virtual line L3, and the fourth virtual line L4.

A rectangular region indicated by one dot chain line in FIGS. 16 to 22 represents the disposition region R2 of the reflective layers in one pixel unit. Details will be described later. A rectangular region indicated by one dot chain line in FIGS. 16 to 22 represents the positions of the reflective layers. Details will be described later.

As understood from FIGS. 14 and 15, a multilayer wiring layer in which a plurality of insulating layers L (LA to LG) and a plurality of conductive layers (wiring layers) are alternately stacked is formed on the surface of the insulating film L0 on which the gate layer of each of the transistors Tdr, Twr, Tcmp, Tel, and Tfix, and the pixel capacitance 132. Each of the insulating layers L is formed of, for example, an insulating inorganic material such as a silicon compound (typically, silicon nitride or silicon oxide). In the following descriptions, a relation in which a plurality of elements is integrally formed in the same process by selective removal of the conductive layer (single layer or plurality of layers) is described as "being formed from the same layer".

The insulating layer LA is formed on the surface of the insulating film L0 in which the gate layer of each of the transistors Tdr, Twr, Tcmp, Tel, and Tfix is formed. As understood from FIGS. 14, 15, and 17, the power source wiring 41 and a plurality of relay electrodes QA (QA13, QA14, QA15, QA16, QA17, QA18, QA19, QA20, and QA21) are formed on the surface of the insulating layer LA from the same layer.

Figure 17:
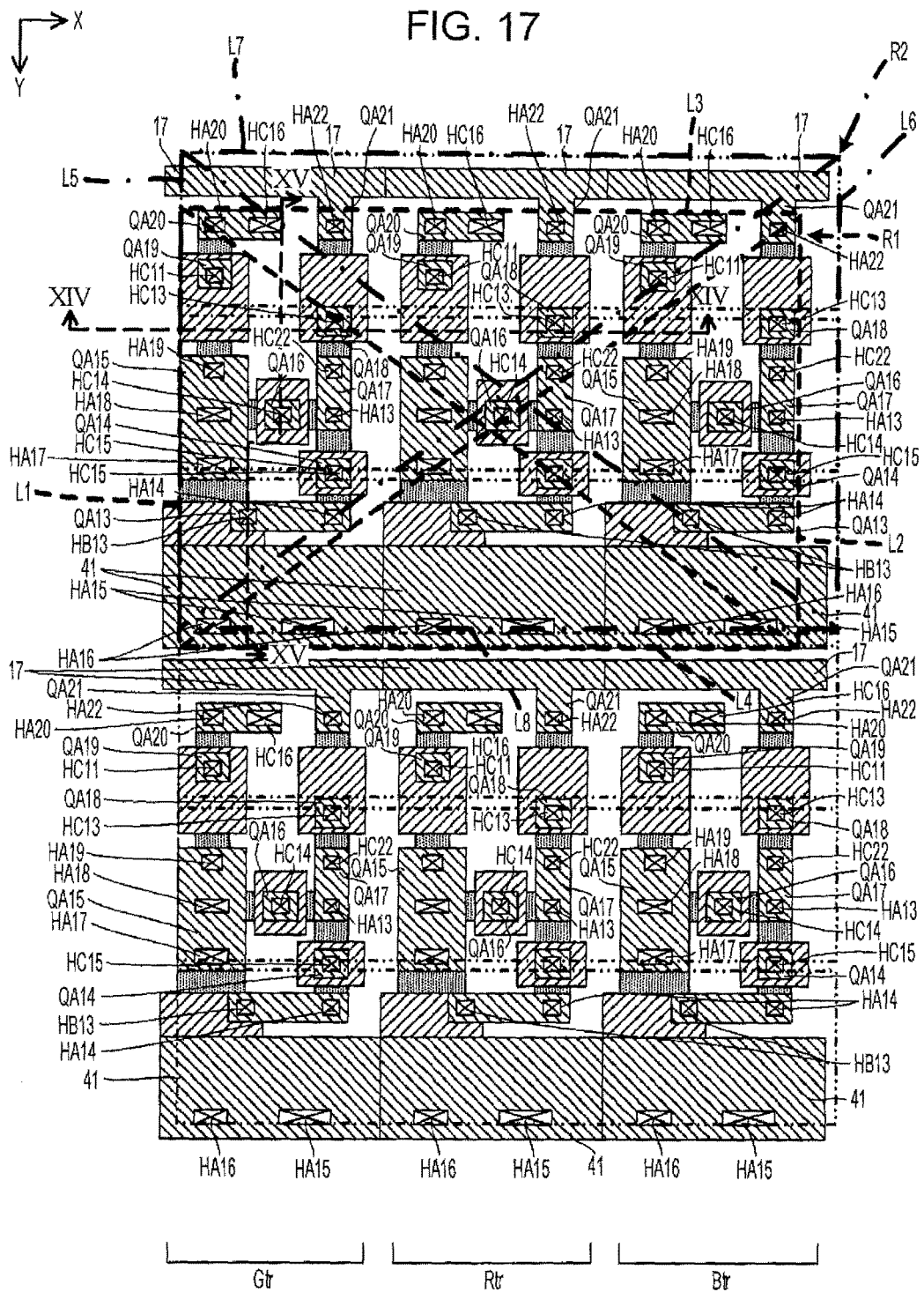
FIG. 17 is a diagram illustrating components formed on the substrate.

The relay electrode QA13 illustrated in FIG. 17 is a source electrode, and is an electrode which is formed so as to directly come into contact with the active region 10A which forms the drain region or the source region of the writing control transistor Twr.

The relay electrode QA15 illustrated in FIG. 17 is also a source electrode, and is an electrode which is formed so as to directly come into contact with the active region 10A which forms the drain region or the source region of the compensation transistor Tcmp, and with the active region 10A which forms the drain region or the source region of the light-emitting control transistor Tel. The relay electrode QA15 is an electrode which is formed so as to directly come into contact with the active region 10A which forms the drain region or the source region of the drive transistor Tdr.

The relay electrode QA17 illustrated in FIG. 17 is also a source electrode, and is an electrode which is formed so as to directly come into contact with the active region 10A which forms the drain region or the source region of the compensation transistor Tcmp, and with the active region 10A which forms the drain region or the source region of the writing control transistor Twr. The relay electrode QA17 is an electrode which is formed so as to directly come into contact with the active region 10A which forms the drain region or the source region of the initialization transistor Tfix.

As understood from FIGS. 15 and 17, the power source wiring 41 is conducted to the active region 10A which forms the source region or the drain region of the drive transistor Tdr, through a conduction hole HA16 which penetrates the insulating layer LA and the insulating film L0. The power source wiring 41 is conducted to the active region 10A which forms the pixel capacitance 132, through a conduction hole HA15 which penetrates the insulating layer LA and the insulating film L0. The power source wiring 41 is extended along a direction (row direction, X direction) of a channel width of the drive transistor Tdr, over the plurality of pixel circuits 110. The power source wiring 41 is electrically connected to a mount terminal to which the power source potential Vel on a high potential side is supplied, through a wiring (not illustrated) in the multilayer wiring layer. Although illustrations are omitted, another power line layer is also formed in the peripheral region of the pixel circuit 110. This power line layer is conducted to a mount terminal to which the power source potential Vct on the low potential side is supplied, through a wiring (not illustrated) in the multilayer wiring layer. The power source wiring 41 and the power line layer to which the power source potential Vct on the low potential side is supplied are formed by a conductive material containing, for example, silver or aluminium, and are formed so as to have a film thickness of about 100 nm, for example.

The gate layer Gdr of the drive transistor Tdr is conducted to the active region 10A which forms the source region or the drain region of the writing control transistor Twr, through the relay electrode QA13, a conduction hole HB13 which penetrates the insulating layer LA, and a conduction hole HA14 which penetrates the insulating layer LA and the insulating film L0.

The relay electrode QA15 and the relay electrode QA17 are formed in the same layer as that for the power source wiring 41, and are formed in each of a conduction portion between the drive transistor Tdr, and the compensation transistor Tcmp and the light-emitting control transistor Tel, and a conduction portion between the compensation transistor Tcmp and the initialization transistor Tfix. The relay electrode QA14 and the relay electrode QA16 are formed in the same layer as that for the power source wiring 41, and are formed in a conduction portion of the gate layer Gwr of the writing control transistor Twr, the gate layer Gcmp of the compensation transistor Tcmp, the gate layer Gel of the light-emitting control transistor Tel, and the gate layer Gfix of the initialization transistor Tfix. The relay electrode QA19 and the relay electrode QA18 are also formed in the same layer as that for the power source wiring 41, and are formed at the conduction portion of these gate layers. The relay electrode QA20 and the relay electrode QA21 are also formed in the same layer as that for the power source wiring 41, and are formed at a conduction portion of the source region or the drain region of the light-emitting control transistor Tel, and a conduction portion of the source region or the drain region of the initialization transistor Tfix.

As understood from FIGS. 14 and 17, the relay electrode QA15 is conducted to the active region 10A which forms the source region or the drain region of the drive transistor Tdr, through a conduction hole HA17 which penetrates the insulating layer LA and the insulating film L0. The relay electrode QA15 is conducted to the active region 10A which forms the drain region or the source region of the compensation transistor Tcmp, through a conduction hole HA18 which penetrates the insulating layer L0 and the insulating film LA. The relay electrode QA15 is conducted to the active region 10A which forms the drain region or the source region of the light-emitting control transistor Tel, through a conduction hole HA19 which penetrates the insulating layer L0 and the insulating film LA.

The relay electrode QA17 is conducted to the active region 10A which forms the drain regions or the source regions of the writing control transistor Twr and the compensation transistor Tcmp, through the conduction hole HA13 which penetrates the insulating layer L0 and the insulating film LA. The relay electrode QA17 is conducted to the active region 10A which forms the drain region or the source region of the initialization transistor Tfix, through a conduction hole HA21 which penetrates the insulating layer L0 and the insulating film LA.

The relay electrode QA20 is conducted to the active region 10A which forms the drain region or the source region of the light-emitting control transistor Tel, through a conduction hole HA20 which penetrates the insulating layer L0 and the insulating film LA. The relay electrode QA21 is conducted to the active region 10A which forms the drain region or the source region of the initialization transistor Tfix, through a conduction hole HA22 which penetrates the insulating layer L0 and the insulating film LA. The relay electrode QA21 is connected to the power feeding line 17 to which an initial potential is supplied.

The insulating layer LB is formed on the surface of the insulating layer LA in which the power source wiring 41 and the plurality of relay electrodes QA (QA13, QA14, QA15, QA16, QA17, QA18, QA19, QA20, and QA21) are formed. As understood from FIGS. 14, 15, and 18, the scanning line 22, the control line 143 of the compensation transistor Tcmp, a control line 144 of the light-emitting control transistor Tel, and a control line 146 of the initialization transistor Tfix are formed on the surface of the insulating layer LB from the same layer. The plurality of relay electrodes QB (QB15 and QB16) is also formed from the same layer.

As understood from FIGS. 14, 15, 17, and 18, the scanning line 22 as an example of the first conductive layer is conducted to the relay electrode QA14 through a conduction hole HC15 which is formed in the insulating layer LB for each of the pixel circuits 110. Thus, as understood from FIGS. 14 to 18, the scanning line 22 is conducted with the gate layer Gwr of the writing control transistor Twr through the conduction hole HC15 which penetrates the insulating layer LB, and the relay electrode QA14, the conduction hole HB15 which penetrates the insulating layer LA. The scanning line 22 is linearly extended in the row direction (X direction) over the plurality of pixel circuits 110, and is electrically insulated from the transfer capacitance 133 and the second data transfer line 26-2 by the insulating layer LC.

Figure 18:
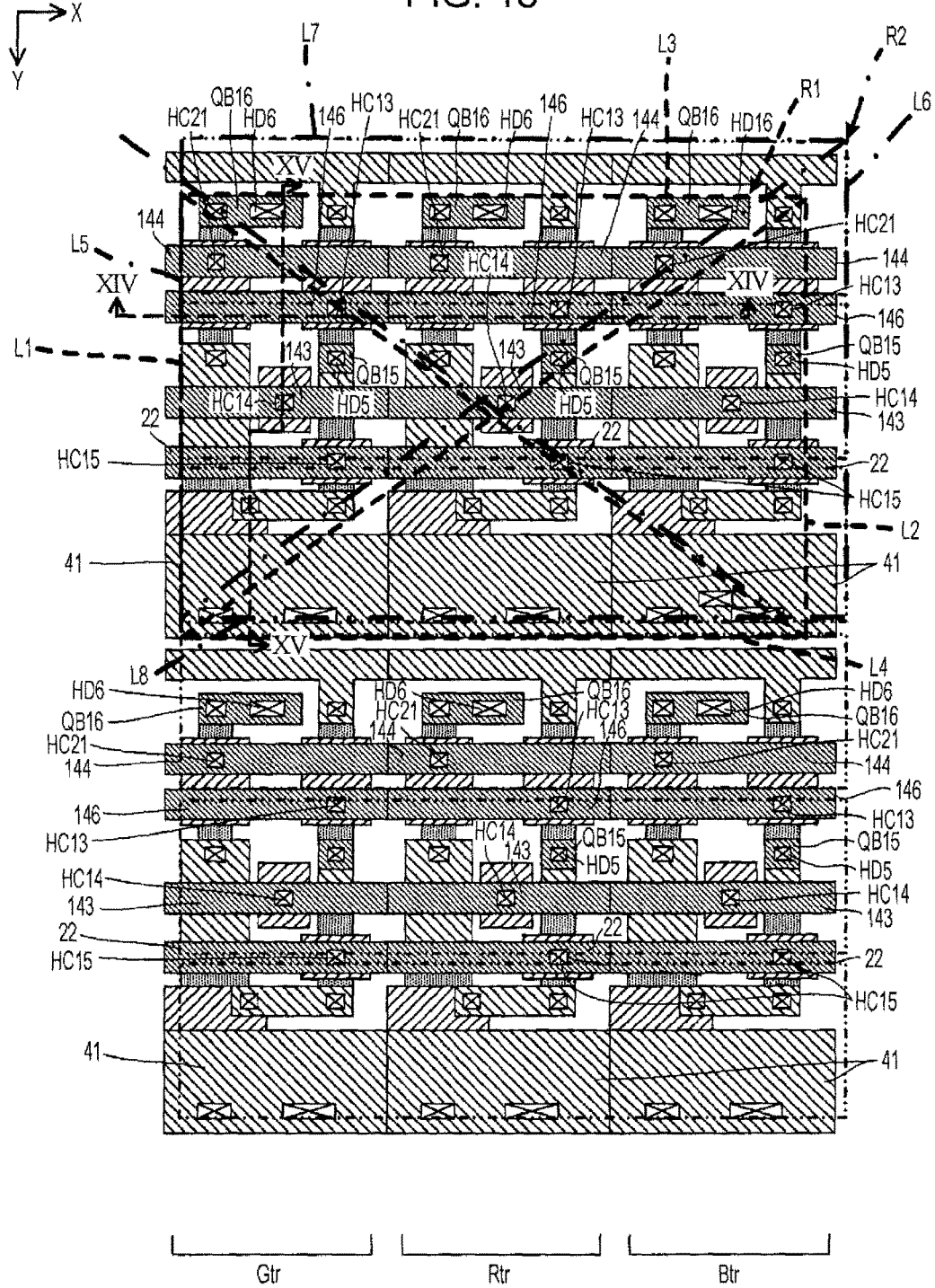
FIG. 18 is a diagram illustrating components formed on the substrate.

As understood from FIG. 18, the control line 143 is conducted to the relay electrode QA16 through a conduction hole HC14 which is formed in the insulating layer LB for each of the pixel circuit 110. Thus, as understood from FIGS. 14 to 18, the control line 143 is conducted to the gate layer Gcmp of the compensation transistor Tcmp through the conduction hole HC14 which penetrates the insulating layer LB, the relay electrode QA16, and the conduction hole HB14 which penetrates the insulating layer LA. The control line 143 is linearly extended in the row direction (X direction) over the plurality of pixel circuits 110, and is electrically insulated from the transfer capacitance 133 and the second data transfer line 26-2 by the insulating layer LC.

As understood from FIG. 18, the control line 144 is conducted to the relay electrode QA19 through a conduction hole HC21 which is formed in the insulating layer LB for each of the pixel circuit 110. Thus, as understood from FIGS. 14 to 18, the control line 144 is conducted to the gate layer Tel of the light-emitting control transistor Tel through the conduction hole HC21 which penetrates the insulating layer LB, the relay electrode QA19, and the conduction hole HB16 which penetrates the insulating layer LA. The control line 144 is linearly extended in the row direction (X direction) over the plurality of pixel circuits 110, and is electrically insulated from the transfer capacitance 133 and the second data transfer line 26-2 by the insulating layer LC.

As understood from FIG. 18, the control line 146 as the fifth conductive layer is conducted to the relay electrode QA18 through the conduction hole HC13 which is formed in the insulating layer LB for each of the pixel circuit 110. Thus, as understood from FIGS. 14 to 18, the control line 146 is conducted to the gate layer Gfix of the initialization transistor Tfix through the conduction hole HC13 which penetrates the insulating layer LB, the relay electrode QA18, and the conduction hole HB17 which penetrates the insulating layer LA. The control line 146 is linearly extended in the row direction (X direction) over the plurality of pixel circuits 110, and is electrically insulated from the transfer capacitance 133 and the second data transfer line 26-2 by the insulating layer LC.

As understood from FIGS. 17 and 18, the relay electrode QB15 is conducted to the relay electrode QA17 through the conduction hole HC22 which is formed in the insulating layer LB for each of the pixel circuits 110. Thus, as understood from FIGS. 14 to 18, the relay electrode QB15 is conducted to the active region 10A through the conduction hole HC22 which penetrates the insulating layer LB, the relay electrode QA17, and the conduction hole HA21 which penetrates the insulating film L0 and the insulating layer LA. This active region 10A is an active region 10A which forms the drain region or the source region of the initialization transistor Tfix.

As understood from FIGS. 17 and 18, the relay electrode QB16 is conducted to the relay electrode QA20 through the conduction hole HC16 which is formed in the insulating layer LB for each of the pixel circuits 110. Thus, as understood from FIGS. 14 to 18, the relay electrode QB16 is conducted to the active region 10A through the conduction hole HC16 which penetrates the insulating layer LB, the relay electrode QA20, and the conduction hole HA20 which penetrates the insulating film L0 and the insulating layer LA. This active region 10A is an active region 10A which forms the drain region or the source region of the light-emitting control transistor Tel.

The insulating layer LC is formed on the surface of the insulating layer LB in which the scanning line 22, the control line 143 of the compensation transistor Tcmp, the control line 144 of the light-emitting control transistor Tel, the control line 146 of the initialization transistor Tfix, and the plurality of relay electrodes QB (QB15 and QB16) are formed. As understood from FIGS. 14, 15, and 19, the second data transfer line 26-2, the second electrode 133-2 of the transfer capacitance 133, which is integrally formed with the second data transfer line 26-2, and the relay electrode QC4 are formed on the surface of the insulating layer LC from the same layer.

Figure 19:
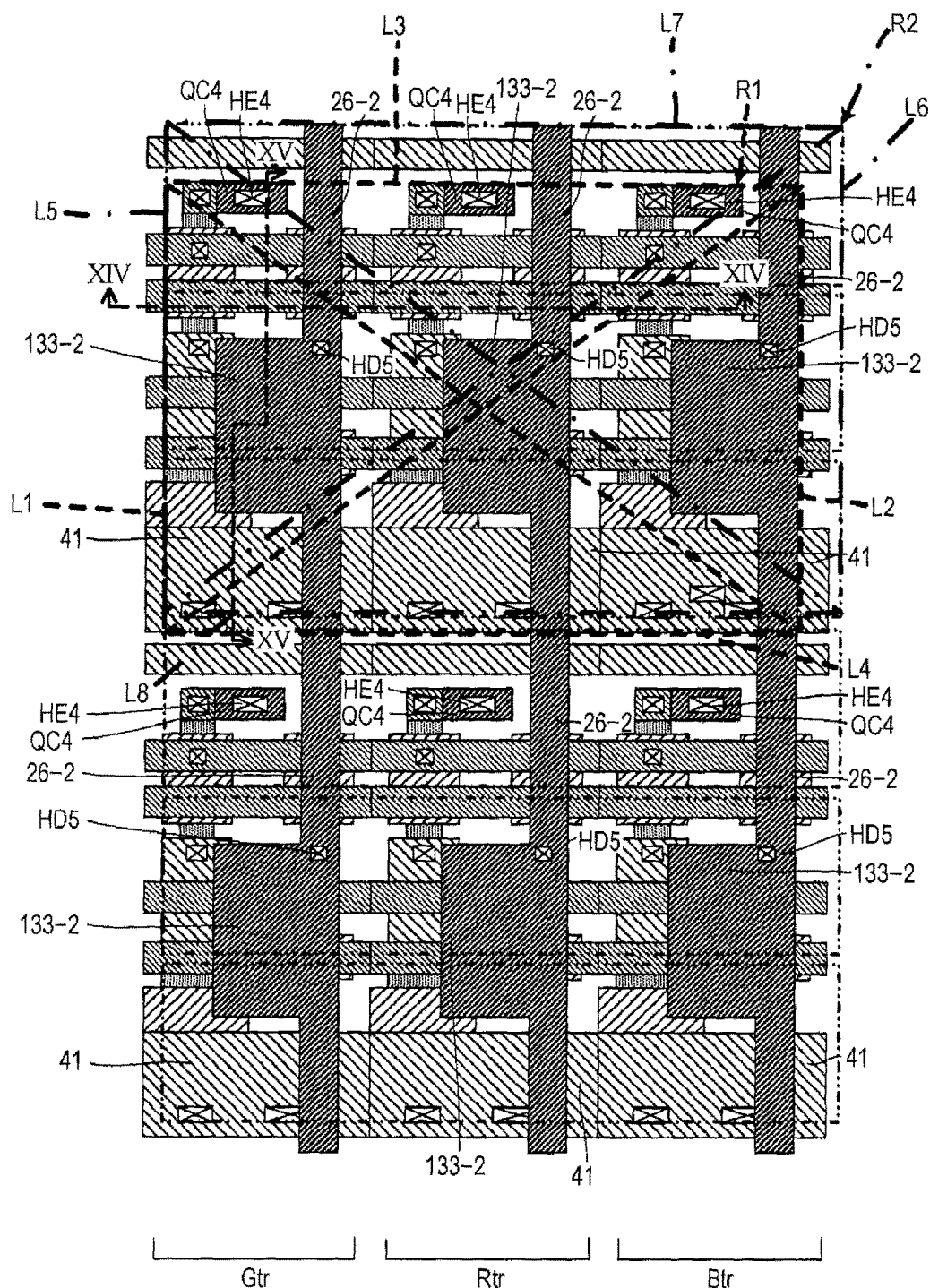
FIG. 19 is a diagram illustrating components formed on the substrate.

As understood from FIG. 19, the second data transfer line 26-2 is extended along the column direction (Y direction) over the plurality of pixel circuits 110. As understood from FIGS. 14 to 19, the second data transfer line 26-2 is conducted to the active region 10A through the conduction hole HD5, the relay electrode QB15, the conduction hole HC22, the relay electrode QA17, and the conduction hole HA21. This active region 10A is an active region 10A which forms the drain region or the source region of the initialization transistor Tfix. The second data transfer line 26-2 is conducted to the active region 10A which forms the drain regions or the source regions of the compensation transistor Tcmp and the writing control transistor Twr through the conduction hole HD5, the relay electrode QB15, the conduction hole HC22, the relay electrode QA17, and the conduction hole HA13.

The second electrode 133-2 of the transfer capacitance 133 is a rectangular electrode which overlaps the scanning line 22, the control line 143, and the control line 146 in a plan view. The second electrode 133-2 of the transfer capacitance 133 is integrally formed with the second data transfer line 26-2.

The insulating layer LD is formed on the surface of the insulating layer LC in which the second data transfer line 26-2, the second electrode 133-2 of the transfer capacitance 133, and the relay electrode QC4 are formed. As understood from FIGS. 14, 15, and 20, the first electrode 133-1 of the transfer capacitance 133 is formed on the surface of the insulating layer LD.

The first electrode 133-1 of the transfer capacitance 133 is a rectangular capacitive electrode which faces the second electrode 133-2 with the insulating layer LD interposed between the first electrode 133-1 and the second electrode 133-2. The first electrode 133-1 faces the second electrode 133-2 with the insulating layer LD interposed between the first electrode 133-1 and the second electrode 133-2. In this manner, the transfer capacitance 133 is formed by a metal-insulator-metal (MIM) structure, and thus capacitance can be increased.

The insulating layer LE is formed on the surface of the insulating layer LD in which the first electrode 133-1 of the transfer capacitance 133 is formed. As understood from FIGS. 14, 15, and 21, the first data transfer line 26-1, the power feeding line 16, and the relay electrodes QD1, QD2, and QD3 are formed on the surface of the insulating layer LE.

The first data transfer line 26-1 as an example of the second conductive layer is extended along the Y direction over the plurality of pixel circuits 110. The first data transfer line 26-1 is conducted to the first electrode 133-1 of the transfer capacitance 133 through conduction holes HF4 and HF5 which penetrate the insulating layer LE.

The power feeding line 16 as the sixth conductive layer is extended along the column direction (Y direction) over the plurality of pixel circuits 110. The power feeding line 16 is formed in the same layer as that for the first data transfer line 26-1, and is disposed so as to have a predetermined gap between the power feeding line 16 and the first data transfer line 26-1, through an insulating layer LF. In this manner, the shield capacitance 134 is formed, and the first data transfer line 26-1 is shielded by the power feeding line 16.

Figure 20:
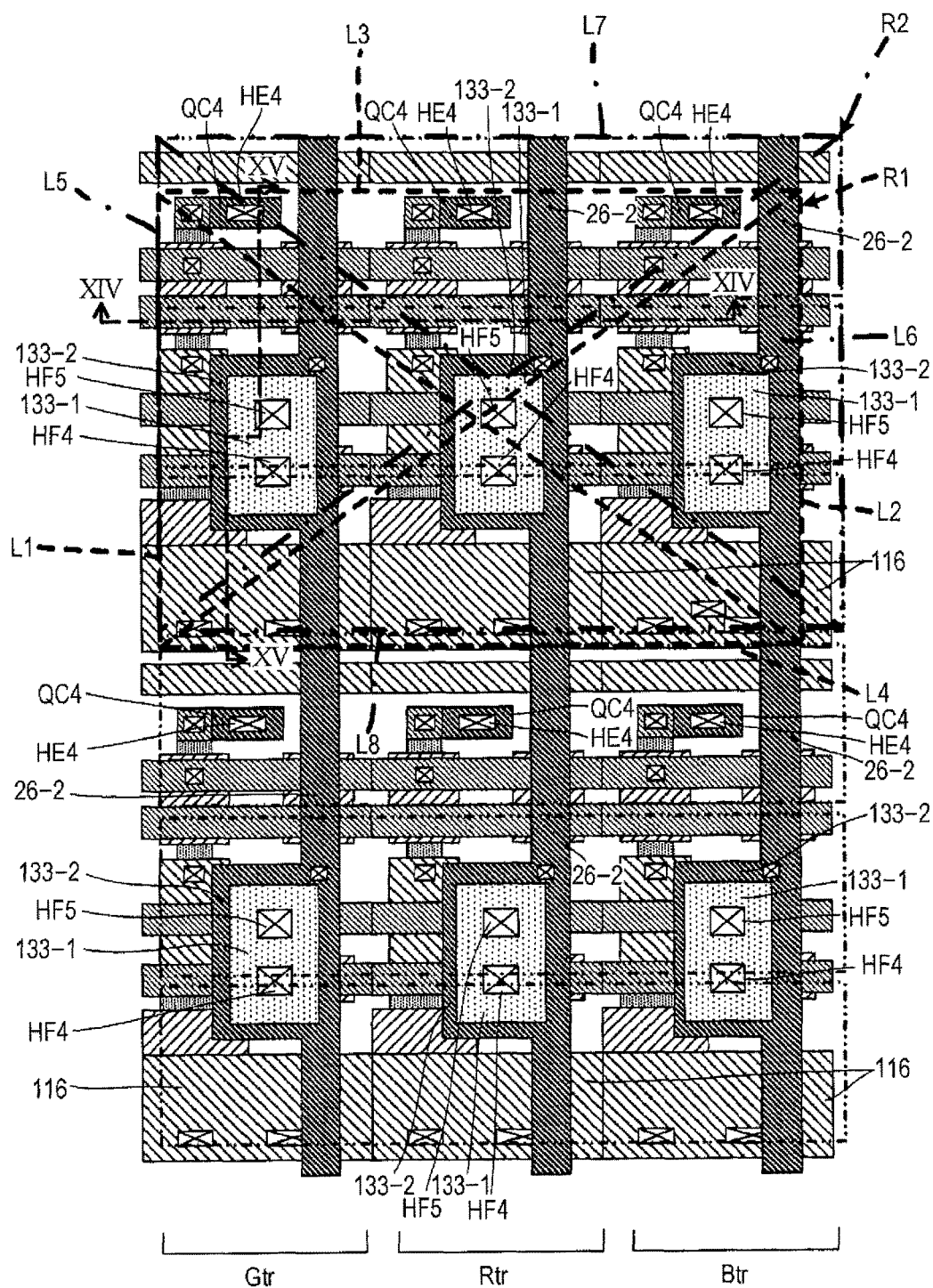
FIG. 20 is a diagram illustrating components formed on the substrate.
Figure 21:
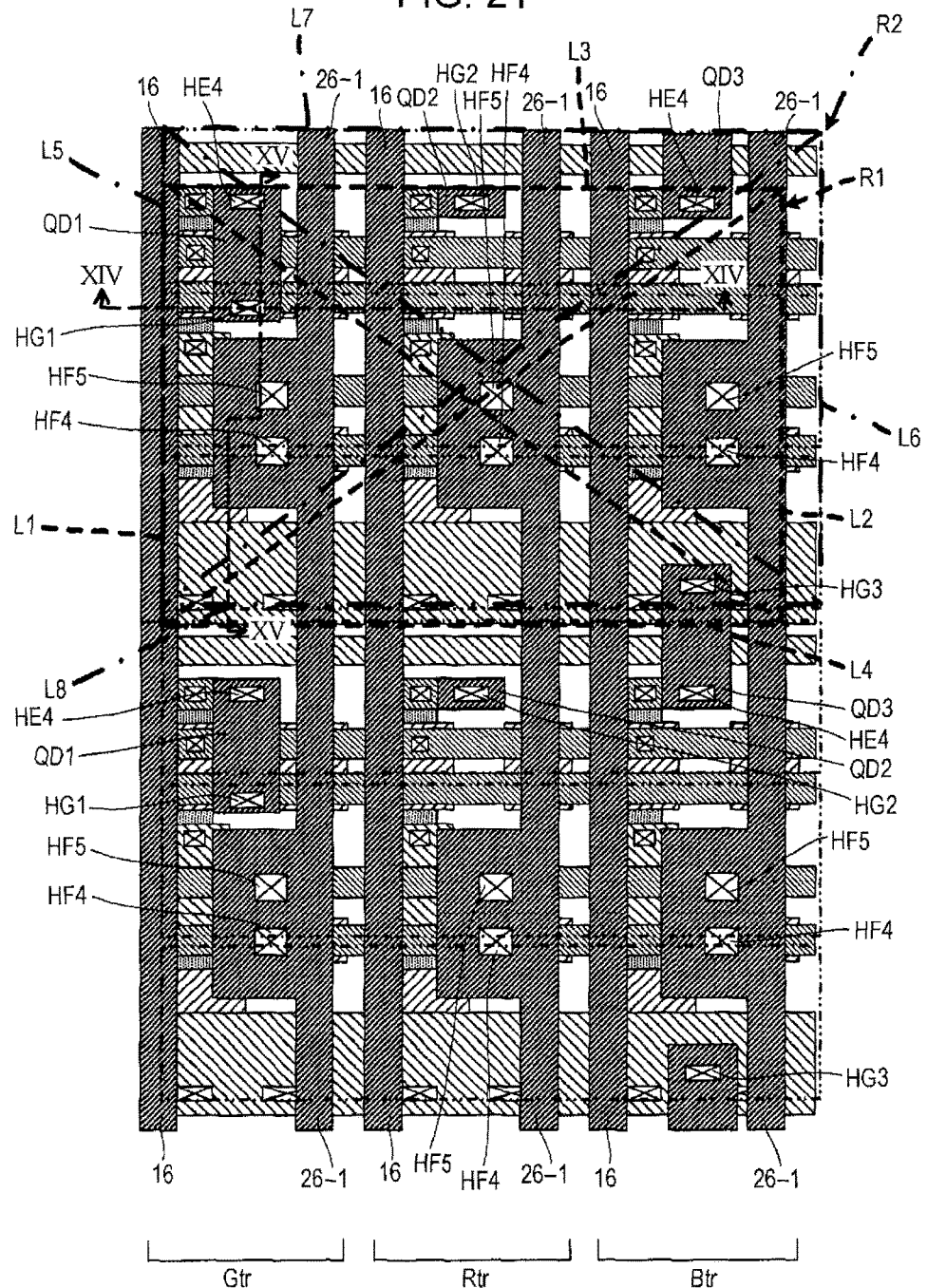
FIG. 21 is a diagram illustrating components formed on the substrate.

As understood from FIGS. 15, 20, and 21, the relay electrode QD1 is conducted to the relay electrode QC4 in a subpixel of a display color of G (green), through a conduction hole HE4 which penetrates the insulating layer LD and the insulating layer LE. Thus, as understood from FIGS. 15 to 21, the relay electrode QD1 is conducted to the active region 10A through the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of a display color of G (green).

As understood from FIGS. 15, 20, and 21, the relay electrode QD2 is conducted to the relay electrode QC4 in a subpixel of a display color of R (red), through the conduction hole HE4 which penetrates the insulating layer LD and the insulating layer LE. Thus, as understood from FIGS. 15 to 21, the relay electrode QD2 is conducted to the active region 10A through the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of a display color of R (red).

As understood from FIGS. 15, 20 and 21, the relay electrode QD3 is conducted to the relay electrode QC4 in a subpixel of a display color of B (blue), through the conduction hole HE4 which penetrates the insulating layer LD and the insulating layer LE. Thus, as understood from FIGS. 15 to 21, the relay electrode QD3 is conducted to the active region 10A through the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of a display color of B (blue).

The insulating layer LF is formed on the surface of the insulating layer LE in which the first data transfer line 26-1, the power feeding line 16, and the relay electrodes QD1, QD2, and QD3 are formed. As understood from FIGS. 14, 15, and 22, the reflective layer 43R, the reflective layer 43G, and the reflective layer 43B are formed on the surface of the insulating layer LF. The reflective layer 43R is a reflective layer in a subpixel of a display color of R (red). The reflective layer 43G is a reflective layer in a subpixel of a display color of G (green). The reflective layer 43B is a reflective layer in a subpixel of a display color of B (blue). As understood from FIG. 22, the reflective layer 43B is disposed along the row direction (X direction), so as to overlap the drive transistors Tdr in subpixels of the colors in a plan view.

The reflective layer 43R is conducted to the relay electrode QD2 through a conduction hole HG2 which penetrates the insulating layer LE. That is, as understood from FIGS. 14 to 22, the reflective layer 43R is conducted to the active region 10A through the conduction hole HG2, the relay electrode QD2, the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of a display color of R (red).

The reflective layer 43G is conducted to the relay electrode QD1 through a conduction hole HG3 which penetrates the insulating layer LE. That is, as understood from FIGS. 14 to 22, the reflective layer 43G is conducted to the active region 10A through the conduction hole HG3, the relay electrode QD1, the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of a display color of G (green).

The reflective layer 43B is conducted to the relay electrode QD3 through a conduction hole HG4 which penetrates the insulating layer LE. That is, as understood from FIGS. 14 to 22, the reflective layer 43B is conducted to the active region 10A through the conduction hole HG4, the relay electrode QD3, the conduction hole HE4, the relay electrode QC4, the conduction hole HD6, the relay electrode QB16, and the conduction hole HA20. This active region 10A is an active region 10A which forms the drain region or the source region of the light-emitting control transistor Tel in the subpixel of B (blue).

Figure 22:
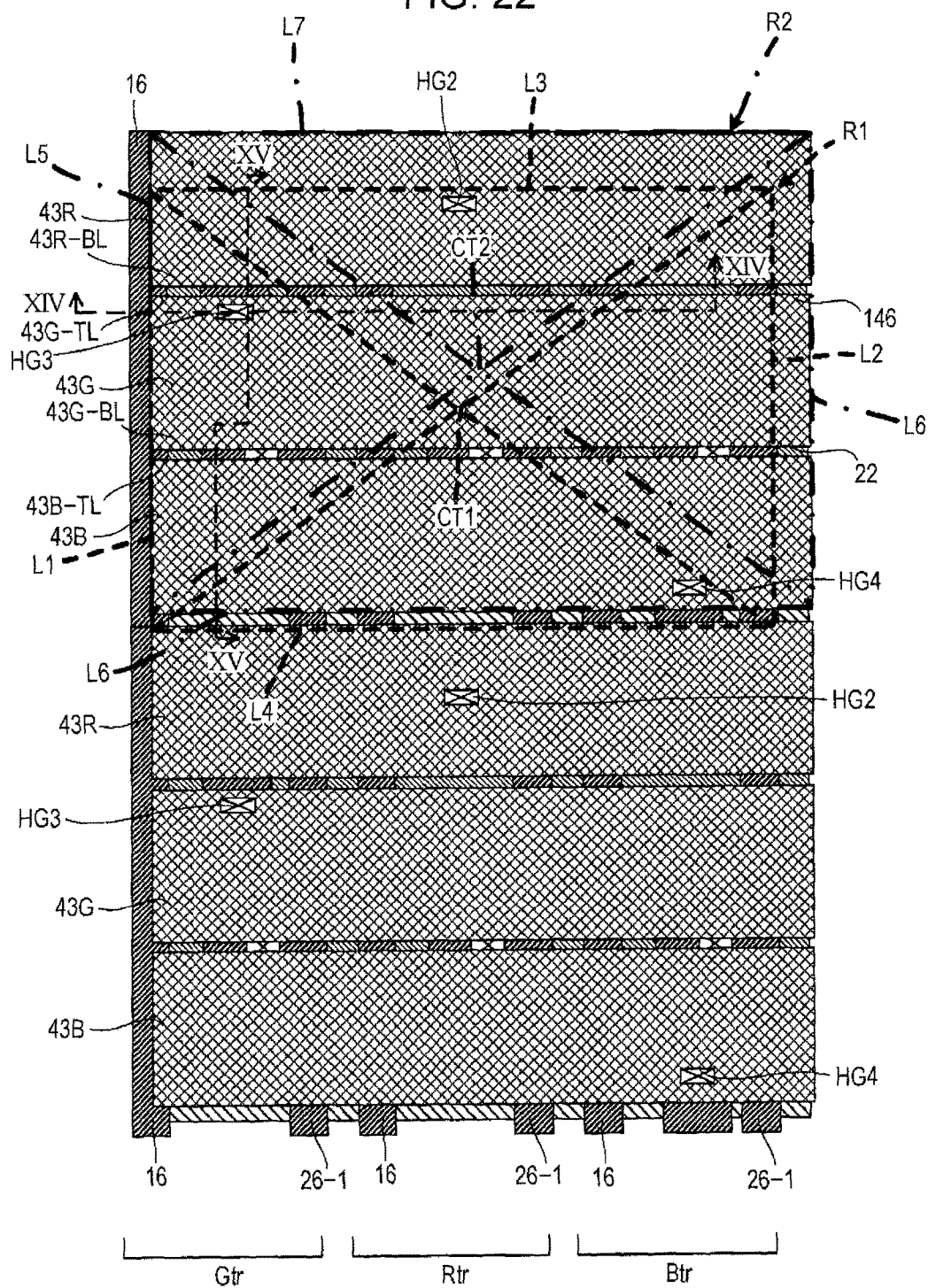
FIG. 22 is a diagram illustrating components formed on the substrate.

As illustrated in FIG. 22, in a plan view, the reflective layers are provided in an order of the reflective layers 43R, 43G, and 43B, and the plurality of transistors in subpixels of the colors which overlap the reflective layers 43R, 43G, and 43B are used as a plurality of transistors in a pixel of one pixel unit. Thus, the reflective layer 43B is conducted to the active region 10A which forms the drain region or the source region of the light-emitting control transistor Tel in a subpixel of B (blue) in a pixel of one pixel unit after one pixel, in the column direction (Y direction).

The reflective layers 43R, 43G, and 43B are formed by, for example, a photoreflective conductive material containing silver or aluminium, and are formed so as to have a film thickness of about 100 nm, for example. As illustrated in FIG. 22, the reflective layers 43R, 43G, and 43B are respectively disposed so as to overlap the transistors in subpixels of the colors in a plan view. Thus, there are advantages in that it is possible to prevent entering of light from the outside by the reflective layers 43R, 43G, and 43B, and to prevent current leakage of each of the transistor occurring by irradiation with light.

In the exemplary embodiment, the plurality of transistors in subpixels of the colors are disposed along the column direction (Y direction). However, the reflective layers 43R, 43G, and 43B in the subpixels of the colors are disposed along the row direction (X direction). Thus, it is possible to commonly use the scanning lines 22 in the writing control transistors Twr in subpixel of the colors, and to form the display region of the subpixel of the colors so as to have a rectangular form in the row direction (X direction).

A rectangular region indicated by one dot chain line in FIGS. 16 to 22 represents the disposition region R2 of the reflective layers 43R, 43G, and 43B as the third conductive layer in one pixel unit. In this exemplary embodiment, a virtual line which passes through sides of the reflective layers 43R, 43G, and 43B and passes through sides of the reflective layers 43R, 43G, and 43B positioned at an end of one direction side (left side in FIGS. 16 to 22) in the row direction (X direction) is defined to be the fifth virtual line L5. A virtual line which passes through sides of the reflective layers 43R, 43G, and 43B positioned at an end of another direction side (right side in FIGS. 16 to 22) in the row direction (X direction) is defined to be the sixth virtual line L6.

In this exemplary embodiment, a virtual line which passes through sides of the reflective layers 43R, 43G, and 43B positioned at an end of one direction side (upper side in FIGS. 16 to 22) in the column direction (Y direction) is defined to be the seventh virtual line L7. A virtual line which passes through sides of the reflective layers 43R, 43G, and 43B positioned at an end of another direction side (lower side in FIGS. 16 to 22) in the column direction (Y direction) is defined to be the eighth virtual line L8.

In the exemplary embodiment, the disposition region R2 of the reflective layers 43R, 43G, and 43B in one pixel unit is defined as a region surrounded by these virtual lines, that is, the fifth virtual line L5, the sixth virtual line L6, the seventh virtual line L7, and the eighth virtual line L8.

As illustrated in FIGS. 14 and 15, an insulating layer LG is formed on the surface of the insulating layer LF in which the reflective layers 43R, 43G, and 43B are formed. A planarization treatment is performed on the surface of the insulating layer LG. The known surface treatment technology such as chemical mechanical polishing (CMP) is randomly employed as the planarization treatment. As illustrated in FIG. 14, a relay electrode QE2 is formed on the surface of the insulating layer LG, which is flattened to a high degree by the planarization treatment.

The relay electrode QE2 is conducted to the reflective layers 43R, 43G, and 43B through a conduction hole HH2 which penetrates the insulating layer LG. The relay electrode QE2 is one of relay electrodes constituting the pixel electrode conduction portion. The relay electrode QE2 is conducted to the active region 10A of the drain region or the source region of the light-emitting control transistor Tel through the reflective layers 43R, 43G, and 43B, the plurality of relay electrodes, and the plurality of conduction holes.

As understood from FIGS. 14 and 15, the optical path adjusting layer 60 is formed on the surface of the insulating layer LG on which the relay electrode QE2 is formed. The optical path adjusting layer 60 is a light-transmissive film member for defining a resonant wavelength (that is, display color) of a resonant structure of each of the pixel circuits 110. Setting is performed as follows. In pixels of which display colors are the same as each other, resonant wavelengths of resonant structures are the same as each other. In pixels of which display colors are different from each other, resonant wavelengths of resonant structures are different from each other. In the exemplary embodiment, as illustrated in FIG. 6, the optical path adjusting layer 60 is formed by two layers, in a subpixel of a display color of R (red). In a subpixel of a display color of G (green), the optical path adjusting layer 60 is formed by one layer. In a subpixel of a display color of B (blue), the optical path adjusting layer 60 is not formed.

As illustrated in FIGS. 14 and 15, the first electrode E1 for each subpixel of each of the colors is formed on the surface of the optical path adjusting layer 60. The first electrode E1 is formed of, for example, a light-transmissive conductive material such as indium tin oxide (ITO). As described above with reference to FIGS. 3 and 4, the first electrode E1 is an electrode (pixel electrode) which has a substantially rectangular shape and functions as an anode of the light emitting element 45. As understood from FIGS. 14 and 15, the first electrode E1 is conducted to the relay electrode QE2 through a conduction hole HI1 which is formed in the optical path adjusting layer 60. Thus, as understood from FIG. 14, the first electrode E1 is conducted to the active region 10A which forms the drain region or the source region of the light-emitting control transistor Tel, through the optical path adjusting layer 60, the reflective layers 43R, 43G, and 43B, the plurality of relay electrodes, and the plurality of conduction holes.

As illustrated in FIGS. 14 and 15, the pixel definition layer 65 is formed on the surface of the optical path adjusting layer 60 on which the first electrode E1 is formed, over the entirety of the substrate 10. The pixel definition layer 65 is formed of, for example, an insulating inorganic material such as a silicon compound (typically, silicon nitride or silicon oxide). The pixel definition layer 65 causes an opening corresponding to the first electrode E1 in a subpixel of each display color to be formed.

The sizes of the openings are equal to each other in subpixel of the colors. The sizes of the openings in subpixel of the colors may be different from each other.

The openings are arranged at a common pitch in the column direction (Y direction), in an order of subpixels of R (red), G (green), and B (blue). Openings in subpixels of the same color are arranged at a common pitch along the row direction (X direction).

As illustrated in FIGS. 14 and 15, the light-emitting function layer 46, the second electrode E2, and the sealing member 47 are stacked on an upper layer of the first electrode E1. The sealing substrate (not illustrated) is bonded to the surface of the substrate 10 in which the above-described elements are formed, by using an adhesive. The sealing substrate is a plate-like member (for example, glass substrate) which is light-transmissive and is used for protecting the elements on the substrate 10. A color filter is formed on the surface of the sealing substrate or the surface of the sealing member 47, for each pixel circuit of a subpixel. As the color filter, a color filter CFB of B (blue), a color filter CFG of G (green), and a color filter CFR of R (red) are used.

As described above, in this exemplary embodiment, the plurality of transistors in subpixels of the colors is disposed in the pixel circuit region of which the width in the row direction (X direction) is narrower than the width in the column direction (Y direction). Thus, the scanning lines 22 can be commonly used in the writing control transistor Twr in subpixels of the colors, and the number of scanning lines 22 selected in one horizontal scanning period is not increased. As a result, it is possible to prevent reducing of a selection time of each of the scanning lines 22 in one horizontal scanning period, and to reliably write data from the data transfer line 26 to the first electrode E1.

In this exemplary embodiment, as illustrated in FIG. 22, the center position CT1 of the disposition region R1 of the plurality of transistors in one pixel unit is different from the center position CT2 of the disposition region R2 of the reflective layers 43R, 43G, and 43B in the one pixel unit.

The sizes of the reflective layers 43R, 43G, and 43B are determined by the sizes of the openings which are defined by the pixel definition layer 65. Thus, the sizes of the reflective layers 43R, 43G, and 43B are limited. In order to reliably prevent irradiation of the transistor with light from the light-emitting function layer 46 by using the reflective layers 43R, 43G, and 43B which have such limited sizes, it is necessary that positions of the reflective layers 43R, 43G, and 43B are appropriately moved.

Thus, in the exemplary embodiment, the center position CT1 of the disposition region R1 of the plurality of transistors is different from the center position CT2 of the disposition region R2 of the reflective layers 43R, 43G, and 43B, and thus the reflective layers 43R, 43G, and 43B cause irradiation of the transistor with light from the light-emitting function layer 46 to be reliably prevented. That is, the reflective layers 43R, 43G, and 43B in subpixels of the colors are disposed along the row direction (X direction), so as to overlap the transistors in subpixels of the colors. Accordingly, it is possible to prevent irradiation of the transistor with light from the light-emitting function layer 46, and the characteristics of the transistor are not changed.

In particular, the reflective layer 43B in a subpixel of blue having the largest area is disposed so as to overlap the drive transistor Tdr in subpixels of the colors. Thus, irradiation of the drive transistor Tdr with light from the light-emitting function layer 46, which influences elaborated gradation display is reliably prevented, and changing characteristics of the drive transistor Tdr is prevented. Thus, accurate gradation display is possible.

In the exemplary embodiment, the power source wiring 41 which is extended in the row direction (X direction) so as to overlap the drive transistor Tdr in a plan view is provided between the reflective layer 43B and the drive transistor Tdr which overlaps the reflective layer 43B. Thus, it is possible to block light from the light-emitting function layer 46 by the power source wiring 41 having an area which is relatively larger than that of other wirings, in addition to the reflective layer 43B, and to prevent irradiation of the drive transistor Tdr further more reliably. Accordingly, irradiation of the drive transistor Tdr with light from the light-emitting function layer 46, which influences elaborated gradation display is further more reliably prevented, and changing characteristics of the drive transistor Tdr is prevented. Thus, accurate gradation display is possible.

In this exemplary embodiment, the fifth virtual line L5 which defines the disposition region R2 of the reflective layers 43R, 43G, and 43B is positioned on the power feeding line 16 as a constant potential line in a plan view. Thus, in a plan view, there is no gap between the reflective layer 43B and the power feeding line 16, and thus it is possible to prevent irradiation of the drive transistor Tdr with light from the light-emitting function layer 46 further more reliably.

In this exemplary embodiment, as illustrated in 22, the side 43R-BL on another side (lower side in FIG. 22) in the column direction (Y direction) among sides of the reflective layer 43R, and the side 43G-TL on one side (upper side in FIG. 22) in the column direction (Y direction) among sides of the reflective layer 43G face each other in the column direction (Y direction). The side 43R-BL and the side 43G-TL are positioned on the control line 146 in a plan view.

Similarly, as illustrated in FIG. 22, the side 43G-BL on another side (lower side in FIG. 22) in the column direction (Y direction) among the sides of the reflective layer 43G, and the side 43B-TL on one side (upper side in FIG. 22) in the column direction (Y direction) among sides of the reflective layer 43B face each other in the column direction (Y direction). The side 43G-BL and the side 43B-TL are positioned on the scanning line 22 in a plan view.

As described above, in this exemplary embodiment, the sides 43R-BL, 43G-TL, 43G-BL, and 43B-TL of the reflective layers 43R, 43G, and 43B, which face each other in the column direction (Y direction) are positioned on the control line 146 and the scanning line 22 in a plan view. Thus, in a plan view, there is no gap between the reflective layer 43R and the reflective layer 43G, and the control line 146, and there is no gap between the reflective layer 43G and the reflective layer 43B, and the scanning line 22. Accordingly, it is possible to prevent irradiation of the transistor with light from the light-emitting function layer 46 further more reliably.

In this exemplary embodiment, the sides of the reflective layers 43R, 43G, and 43B, which face each other in the column direction are positioned on the control line 146 and the scanning line 22 in a plan view. However, the embodiment is not limited to such a configuration, and sides which face each other in the column direction in at least two reflective layers which are adjacent in the column direction may be positioned on the control line or the scanning line 22 in a plan view. The control line may be the control lines 144 and 143 in addition to the control line 146.

In this exemplary embodiment, the second virtual line L2 which defines the disposition region R2 of the reflective layers 43R, 43G, and 43B is positioned on the first data transfer line 26-1 in a plan view. Thus, in a plan view, there is no gap between the reflective layers 43R, 43G, and 43B, and the first data transfer line 26-1. Accordingly, it is possible to prevent irradiation of the transistor with light from the light-emitting function layer 46 further more reliably. In a plan view, the first virtual line L1 which defines the disposition region R2 of the reflective layers 43R, 43G, and 43B may be positioned on the first data transfer line 26-1, or both of the second virtual line L2 and the first virtual line L1 may be positioned on the first data transfer line 26-1.

In the exemplary embodiment, the plurality of transistors in subpixels of the colors are disposed along the column direction (Y direction), and the reflective layers 43B, 43G, and 43R in the subpixels of the colors are disposed along the row direction (X direction). Thus, even in a case where a direction to which the main light line of the electro-optical device 1 is largely inclined is designed so as to be set as the row direction (X direction), it is possible to arrange subpixels of the same color in the row direction (X direction) of the display surface, without an increase of the number of scanning lines 22. As a result, the electro-optical device 1 in which color shift hardly occurs regarding the row direction (X direction) even though the display surface is observed at an inclined angle is provided.

Modification Example

The embodiment is not limited to the above-described exemplary embodiments. For example, various modifications as will be described below can be made. The exemplary embodiments and modification examples may be appropriately combined.

(1) In the above-described exemplary embodiments, a configuration in which the optical path adjusting layer is provided between the reflective layer and the pixel electrode is described. However, the embodiment is not limited to this configuration. The optical path adjusting layer may be omitted, and a pixel electrode having reflexibility may be used. In this case, the third conductive layer may be obtained by integrally forming the reflective layer and the pixel electrode.

(2) In the above-described exemplary embodiments, a configuration in which a sealing film and the color filter are stacked on an OLED is described. However, the embodiment is not limited to this configuration. The color filter may be provided on a counter substrate.

(3) In the above-described exemplary embodiments, in a pixel of one pixel unit, the openings in subpixels of the colors are provided to be extended in the row direction (X direction), and openings in subpixels of the same color are arranged at a common pitch in the row direction (X direction), over pixels of a plurality of one pixel units. In the pixel of one pixel unit, the openings are arranged so as to cause the widths of the openings in subpixels of the colors in the row direction (X direction) to be equal to each other. That is, the reflective layers in subpixels of the colors are arranged along the row direction (X direction), so as to overlap at least one transistor in the subpixels of the colors.

However, the embodiment is not limited to such a configuration. For example, the reflective layer in a subpixel of at least one color may be disposed along the row direction (X direction), so as to overlap at least one transistor in the subpixels of the colors. In this case, reflective layers in subpixels of other colors are arranged so as to overlap at least one transistor in a subpixels of at least one color, and reflective layers in subpixels of different colors are arranged along the row direction (X direction).

For example, the opening in a subpixel of blue may be extended in the row direction (X direction) over an inside of the pixel of one pixel unit, and thus the width of the opening in the row direction (X direction) may be largest. The opening in a subpixel of red and the opening in a subpixel of green may be arranged in parallel to the row direction (X direction) in the pixel of one pixel unit.

(4) In the above-described exemplary embodiments, the power source wiring is disposed between the reflective layer and the drive transistor. However, a metal wire other than the power source wiring may be disposed. The metal wiring is disposed between the reflective layer and the drive transistor, and thus it is possible to reliably block light applied to the drive transistor.

(5) In the above-described exemplary embodiments, an OLED is employed as an example of an electro-optical material. However, the embodiment is also applied to an electro-optical device using an electro-optical material other than the OLED. The electro-optical material is a material of which optical characteristics such as transmittance or luminance are changed by supplying an electrical signal (current signal or voltage signal). For example, the embodiment may be also applied to a display panel using a light emitting element of liquid crystal, inorganic EL, light-emitting polymer, or the like, similarly to the exemplary embodiments. Similarly to the exemplary embodiments, the embodiment may be also applied to an electrophoresis display panel which uses a microcapsule as the electro-optical material. The microcapsule contains a colored liquid, and white particles dispersed in the liquid. Similarly to the exemplary embodiments, the embodiment may be also applied to a twist ball display panel which uses a twist ball as the electro-optical material. The twist ball is separately coated with different colors for each region which has a different polarity. Similarly to the exemplary embodiments, the embodiment may be also applied to various electro-optical devices such as a toner display panel and a plasma display panel. The toner display panel uses a black toner as the electro-optical material. The plasma display panel uses high pressure gases of helium, neon, or the like, as the electro-optical material.

Application Example

Figure 23:
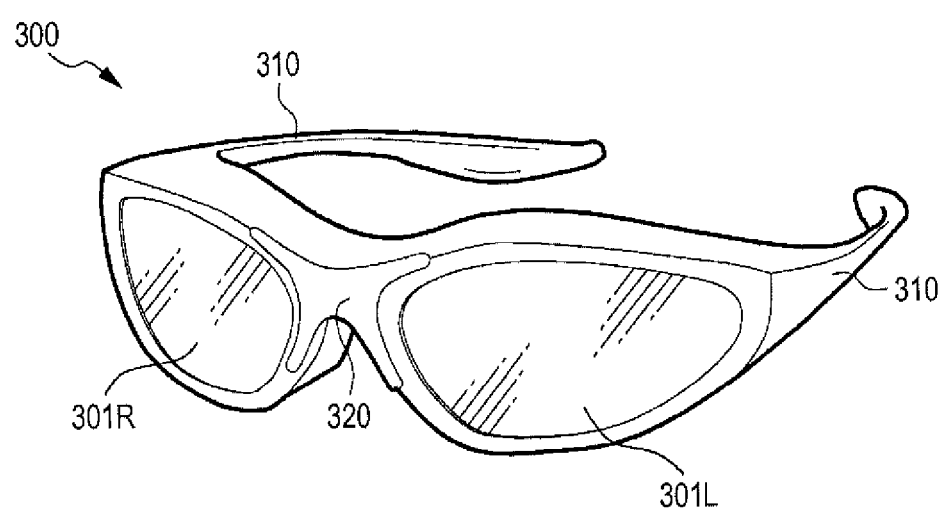
FIG. 23 is a diagram illustrating an example of an electronic apparatus.
Figure 24:
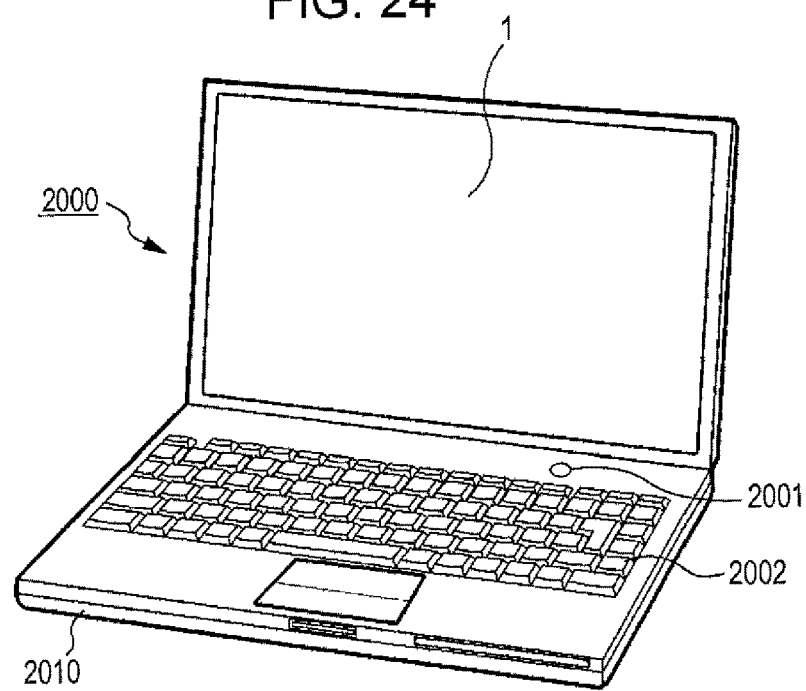
FIG. 24 is a diagram illustrating another example of the electronic apparatus.
Figure 25:
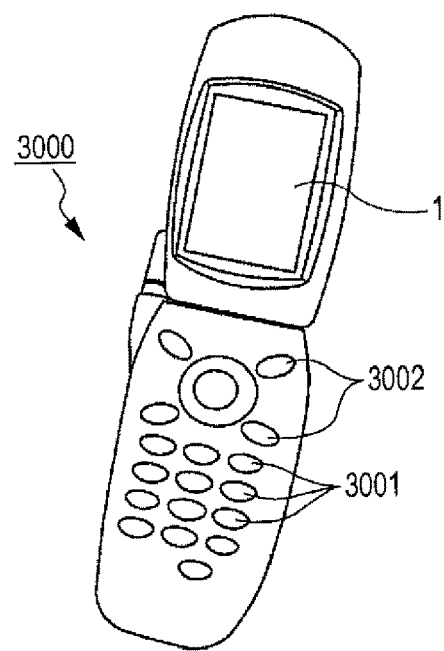
FIG. 25 is a diagram illustrating still another example of the electronic apparatus.

The embodiment may be used in various electronic apparatuses. FIGS. 23 to 25 illustrate specific forms of an electronic apparatus which is an application target for the embodiment.

FIG. 23 is a perspective view illustrating an appearance of a head mounted display of a head mounted display as an electronic apparatus which employs the electro-optical device according to the embodiment. As illustrated in FIG. 23, a head mounted display 300 includes a temple 310 which is similar to general glasses, a bridge 320, and projection optical systems 301L and 301R, in appearance. Although illustrations are omitted, an electro-optical device 1 for a left eye, and an electro-optical device 1 for a right eye are provided on a depth side of the projection optical systems 301L and 301R, which is near to the bridge 320.

FIG. 24 is a perspective view of a portable type personal computer which employs the electro-optical device. A personal computer 2000 includes the electro-optical device 1 that displays various images, and a main body portion 2010 in which a power switch 2001 and a keyboard 2002 are installed.

FIG. 25 is a perspective view illustrating a portable telephone. A portable telephone 3000 includes various operation buttons 3001, a scroll button 3002, and the electro-optical device 1 that displays various images. The scroll button 3002 is operated, and thus a screen displayed in the electro-optical device 1 is scrolled. The embodiment can be also applied to such a portable telephone.

Examples of the electronic apparatus to which the embodiment is applied include a personal digital assistant (PDA) in addition to the devices illustrated in FIGS. 23 to 25. In addition, a digital still camera, a TV, a video camera, a car navigation device, an in-vehicle indicator (instrument panel), an electronic note, electronic paper, an electronic calculator, a word processor, a work station, a picture phone, and a POS terminal are exemplified. Further, devices including a printer, a scanner, a copier, a video player, and a touch panel are exemplified.

The entire disclosure of Japanese Patent Application No. 2016-025617, filed Feb. 15, 2016 is expressly incorporated by reference herein.

What is claimed is:

1. An electro-optical device comprising:
   a first subpixel having a first reflective layer refracting light from the first subpixel;
   a first circuit controlling a first current of the first subpixel based on a first data potential and having a first driving transistor;
   a second subpixel having a second reflective layer refracting light from the second subpixel;
   a second circuit controlling a second current of the second subpixel based on a second data potential and having a second driving transistor;
   a third subpixel having a third reflective layer refracting light from the third subpixel;
   a third circuit controlling a third current of the third subpixel based on a third data potential and having a third driving transistor,
   wherein the first reflective layer overlaps the first driving transistor, the second driving transistor, and the third driving transistor in plan view, and
   wherein area of the first subpixel is larger than that of the second subpixel and that of the third subpixel.

2. The electro-optical device according to claim 1, further comprising:
   a power source wiring connected to the first driving transistor, the second driving transistor, and the third driving transistor,
   wherein the power source wiring is disposed between the first reflective layer and the first drive transistor and is disposed so as to overlap the first drive transistor in plan view,
   wherein the power source wiring is disposed between the first reflective layer and the second drive transistor and is disposed so as to overlap the second drive transistor in plan view, and
   wherein the power source wiring is disposed between the first reflective layer and the third drive transistor and is disposed so as to overlap the third drive transistor in plan view.

3. The electro-optical device according to claim 2, wherein the first reflective layer has an edge which overlaps the power source wiring in plan view.

4. The electro-optical device according to claim 2, wherein the entirety of the first reflective layer overlaps the power source wiring in plan view.

5. The electro-optical device according to claim 1, wherein the first subpixel has a first shape that is longer in a first direction than a second direction perpendicular to the first direction.

6. The electro-optical device according to claim 5, wherein the first circuit is formed in a shape that is longer in the second direction than the first direction,
   wherein the second circuit is formed in a shape that is longer in the second direction than the first direction,
   wherein the third circuit is formed in a shape that is longer in the second direction than the first direction,
   wherein the first subpixel has a first shape that is longer in a first direction than a second direction perpendicular to the first direction.

7. The electro-optical device according to claim 5,
   wherein the first circuit has a first writing control transistor,
   wherein the second circuit has a second writing control transistor,
   wherein the third circuit has a third writing control transistor, and
   wherein a first gate of the first writing control transistor, a second gate of the second writing control transistor, and a third gate of the third writing control transistor is conducted to a scanning line.

8. The electro-optical device according to claim 7, wherein the scanning line extends in the first direction.

9. An electro-optical device comprising:
   a blue subpixel having a first reflective layer refracting light from the blue subpixel;
   a first circuit controlling a first current of the blue subpixel based on a first data potential and having a first driving transistor;
   a green subpixel having a second reflective layer refracting light from the green subpixel;
   a second circuit controlling a second current of the green subpixel based on a second data potential and having a second driving transistor;
   a red subpixel having a third reflective layer refracting light from the red subpixel;

a third circuit controlling a third current of the red subpixel based on a third data potential and having a third driving transistor, wherein the first reflective layer overlaps the first driving transistor, the second driving transistor, and the third driving transistor in plan view.

10. The electro-optical device according to claim 9, further comprising:

a power source wiring connected to the first driving transistor, the second driving transistor, and the third driving transistor, wherein the power source wiring is disposed between the first reflective layer and the first drive transistor and is disposed so as to overlap the first drive transistor in plan view, wherein the power source wiring is disposed between the first reflective layer and the second drive transistor and is disposed so as to overlap the second drive transistor in plan view, and wherein the power source wiring is disposed between the first reflective layer and the third drive transistor and is disposed so as to overlap the third drive transistor in plan view.

11. An electronic apparatus comprising:
the electro-optical device according to claim 1.

12. An electronic apparatus comprising:
the electro-optical device according to claim 2.

13. An electronic apparatus comprising:
the electro-optical device according to claim 3.

14. An electronic apparatus comprising:
the electro-optical device according to claim 4.

15. An electronic apparatus comprising:
the electro-optical device according to claim 5.

16. An electronic apparatus comprising:
the electro-optical device according to claim 6.

17. An electronic apparatus comprising:
the electro-optical device according to claim 7.

18. An electronic apparatus comprising:
the electro-optical device according to claim 8.

19. An electronic apparatus comprising:
the electro-optical device according to claim 9.

20. An electronic apparatus comprising:
the electro-optical device according to claim 10.

\* \* \* \* \*